(12) United States Patent
Eldridge et al.

(10) Patent No.: US 7,808,259 B2
(45) Date of Patent: Oct. 5, 2010

(54) COMPONENT ASSEMBLY AND ALIGNMENT

(75) Inventors: Benjamin N. Eldridge, Danville, CA (US); Eric D. Hobbs, Livermore, CA (US); Gaetan L. Mathieu, Vareness, CA (US)

(73) Assignee: FormFactor, Inc., Livermore, CA (US)

( * ) Notice: Subject to any disclaimer, the term of this patent is extended or adjusted under 35 U.S.C. 154(b) by 163 days.

(21) Appl. No.: 11/861,559

(22) Filed: Sep. 26, 2007

(65) Prior Publication Data
US 2009/0079452 A1    Mar. 26, 2009

(51) Int. Cl.
*G01R 31/02* (2006.01)
(52) U.S. Cl. ...................................................... 324/758
(58) Field of Classification Search ................. 324/754, 324/765, 761–762, 760
See application file for complete search history.

(56) References Cited

U.S. PATENT DOCUMENTS

| | | | |
|---|---|---|---|
| 5,473,510 A * | 12/1995 | Dozier, II | 361/719 |
| 5,534,784 A * | 7/1996 | Lum et al. | 324/757 |
| 5,974,662 A | 11/1999 | Eldridge et al. | |
| 6,509,751 B1 | 1/2003 | Mathieu et al. | |
| 6,640,415 B2 | 11/2003 | Eslamy et al. | |
| 6,690,185 B1 | 2/2004 | Khandros et al. | |
| 6,784,678 B2 | 8/2004 | Pietzschmann | |
| 7,064,566 B2 | 6/2006 | Khandros et al. | |
| 7,140,883 B2 | 11/2006 | Khandros et al. | |
| 7,230,437 B2 | 6/2007 | Eldridge et al. | |
| 7,471,094 B2 * | 12/2008 | Hobbs et al. | 324/754 |
| 2002/0132501 A1 | 9/2002 | Eldridge et al. | |
| 2006/0038172 A1 | 2/2006 | Akram | |
| 2006/0279300 A1 | 12/2006 | Khandros et al. | |
| 2006/0290367 A1 | 12/2006 | Hobbs et al. | |
| 2007/0007977 A1 | 1/2007 | Eldridge et al. | |
| 2007/0126435 A1 | 6/2007 | Eldridge et al. | |
| 2007/0126440 A1 | 6/2007 | Hobbs et al. | |

FOREIGN PATENT DOCUMENTS

| | | |
|---|---|---|
| JP | 02-144869 | 11/1998 |
| JP | 2004-095548 | 3/2004 |

OTHER PUBLICATIONS

PCT/US2008/077984: International Search Report and Written Opinion of the International Searching Authority.
U.S. Appl. No. 11/464,593, filed Aug. 15, 2006, Hobbs et al.
PCT/US2008/077984, International Preliminary Report On Patentability (Mar. 30, 2010), 5 pages.

* cited by examiner

*Primary Examiner*—Ha Tran T Nguyen
*Assistant Examiner*—Tung X Nguyen
(74) *Attorney, Agent, or Firm*—N. Kenneth Burraston

(57) ABSTRACT

A method or an apparatus for aligning a plurality of structures can include applying a first force in a first plane to a first structure. The method can also include constraining in the first plane the first structure with respect to a second structure such that the first structure is in a position with respect to the second structure that aligns first features on the first structure with second features on the second structures. The second feature can be in a second plane that is generally parallel to the first plane. The first and second structures can be first and second electronic components, which can be components of a probe card assembly.

20 Claims, 23 Drawing Sheets

COMPONENT ASSEMBLY AND ALIGNMENT

BACKGROUND

The present invention relates generally to aligning two or more structures or devices one with another. There are many possible applications in which there is a need to align two or more structures or devices. One non-limiting, exemplary application is in devices or apparatuses for testing electronic devices such as semiconductor devices (e.g., semiconductor dies).

Semiconductor devices, such as microprocessors, DRAM, and flash memory, are fabricated in a known manner on a semiconductor wafer. Depending upon the size of the wafer and of each device formed thereon, there may be as many as several hundred devices on a single wafer. These devices are typically identical to one another, each including a plurality of conductive pads on the surface thereof for power and other connections to the devices such as input signals, output signals, control signals and the like.

It is desirable to test the devices on the wafer to determine which are fully functional, and which are inoperative or partially functional. To this end, testers apply power and input signals to the devices and monitor outputs during a predetermined testing routine. In the case of semiconductor dies, such testing can be performed while the dies are still on the wafer and/or after the dies are singulated from the wafer.

In some cases, multiple identical devices are tested. In such cases, a contactor device with multiple identical groups of probes, each configured to contact one of the devices, can be used to simultaneously contact and test multiple ones of the devices. The probes can be configured to make discrete pressure connections to separate ones of the pads or terminals on corresponding devices.

A contactor device (e.g., a probe card assembly) for contacting such devices during testing of the devices can require significant manual adjustment and aligning during different stages of assembly. Furthermore, as a contactor device is transported or used in operation to test the devices, components of the contactor device may require further adjustment or realignment. Additionally, as components fail over time, the replacement and repair of the components is both time consuming and costly. Having a contactor device that is inoperable for even a short period of time may result in significant loss of production.

Although the present invention is not so limited, some embodiments of the present invention can address the foregoing problems as well as other problems in contactor devices as well as problems aligning two or more structures in other apparatuses.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

FIGS. 1-6 illustrate an exemplary technique in which a first structure 212 can be biased and/or constrained with respect to a second structure 202 such that the first structure 212 is aligned with the second structure 202 according to some embodiments of the invention.

Figure 1:
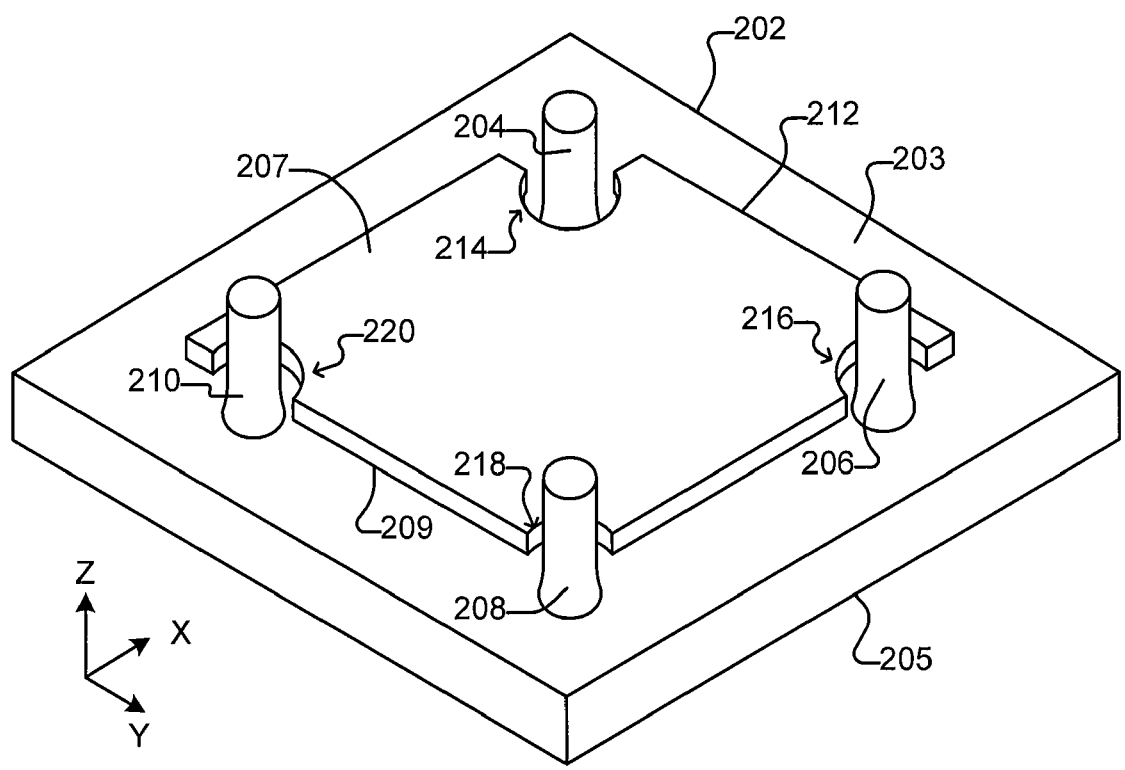
FIG. 1 illustrates a first structure that is to be aligned with a second structure according to some embodiments of the invention.

FIG. 1 illustrates a perspective view of an exemplary first structure 212 and an exemplary second structure 202. In the exemplary configuration shown in FIG. 1, the first structure 212 can by any structure, device, apparatus, etc. that is to be aligned with the second structure 202. In some exemplary embodiments, the first structure 212 can comprise a substrate (e.g., a block of material, such as semiconductor material, ceramic material, printed circuit board material, plastic, etc.) with opposing surfaces 207, 209 and a plurality of biasing/docking features 214, 216, 218, 220. In the exemplary configuration shown in FIG. 1, the features 214, 216, 218, 220 can be cutouts in the substrate. Cutouts are, however, exemplary only, and features 214, 216, 218, 220 can take many other forms (e.g., attachments to the substrate, etc.). Also, although four features 214, 216, 218, 220 are shown in the exemplary configuration in FIG. 1, more or fewer can be used in other configurations.

The second structure 202 can be any structure, device, apparatus, etc. to which the first structure 212 is to be aligned. For example, the second structure 202 can comprise a substrate 202 to which a plurality of alignment features 204, 206, 208, 210 are attached. In the exemplary configuration shown in FIG. 1, the alignment features 204, 206, 208, 210 can be studs attached to a surface 203 of the second structure 202. (Surface 205 can be a surface of the second structure 202 that is opposite surface 203.) Studs, however, are non-limiting examples of the alignment features 204, 206, 208, 210, which can comprise many other structures, apparatuses, etc. Indeed, in some embodiments, it is sufficient that at least some of the alignment features 204, 206, 208, 210 correspond to at least some of the docking/biasing features 214, 216, 218, 220 such that the some of the docking/biasing features 214, 216, 218, 220 can dock with the at least some of the alignment features 204, 206, 208, 210 to constrain movement of the first structure 212 while a biasing force is applied to the first structure 212 and thus hold the first structure 212 in alignment with the second structure 202. Although four alignment features 204, 206, 208, 210 are shown in the exemplary configuration in FIG. 1, more or fewer can be used in other configurations.

FIGS. 2-6 illustrate an exemplary manner in which the first structure 212 can be biased into and/or constrained in a position in which the first structure 212 is aligned with the second structure 202.

Figure 2:
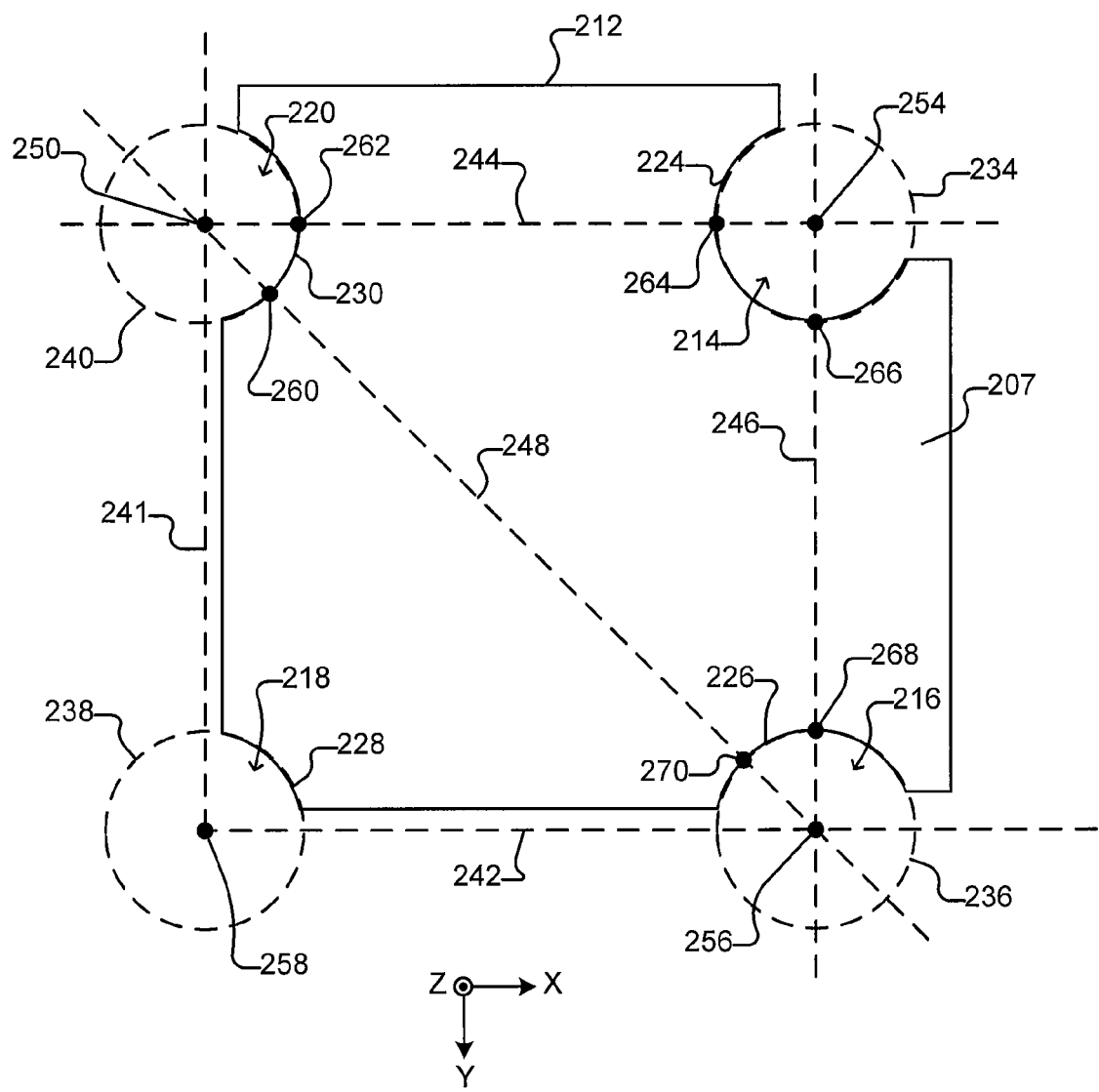
FIG. 2 illustrates exemplary constraint lines with respect to the first structure of FIG. 1 according to some embodiments of the invention.

Referring to FIG. 2 (which shows a top view of the first structure 212), a biasing force (not shown) can be applied from a point 258 against an edge 228 of one of the docking/biasing features 218, and constraints constraining movement of the first structure 212 can be placed at one or more points on edge 224 of docking/biasing feature 214, edge 226 of docking/biasing feature 216, and/or edge 230 of docking/biasing feature 230. In the examples shown in FIGS. 1-6, the edges 224, 226, 228, 230 can be arcs of imaginary circles (234, 236, 238, 240). A biasing force (not shown in FIG. 2) can resolve into components directed along imaginary lines 241, 242 connecting a center point 258 of the circle 238 of which edge 228 is a part with center points 250, 256 of the circles 240, 236 of which edges 230, 226 form a part. The first structure 212 can be kinematically constrained along imaginary lines 244, 246 that are generally parallel to, respectively, lines 241, 242 and pass through center points 250, 254, 256 as shown in FIG. 2. The first structure can also be kinematically constrained along constraint line 248 connecting the center points 250, 256. That is, the first structure 212 can be kinematically constrained in a two-dimensional plane (the x-y plane in FIG. 2) by constraining the first structure 212 along constraint lines 244, 246, 248 in FIG. 2. As is known, a constraint line (as used in the field of kinematics and as used herein) can be a line along which a body cannot move, and the first structure 212 can be constrained by resolving the placement of constraints.

The term "kinematically constrained" can refer to the use of a minimum number of constraints to constrain a body in a given number of degrees of freedom of movement of the body. For example, with reference to a standard "x, y, z" coordinate system, an unconstrained body can move with six degrees of freedom: translation along the "x" axis, translation along the "y" axis, translation along the "z" axis, rotation about the "x" axis, rotation about the "y" axis, and rotation about the "z" axis. To be kinematically constrained with "N" degrees of freedom (that is, constrained such that it can move in only N of the six foregoing degrees of freedom), that body can be constrained by no more than six minus N constraints. Thus, to be kinematically constrained with no degrees of freedom of movement, the body can be constrained with no more than six constraints. It is noted that, in one plane, an unconstrained body has three degrees of freedom of movement. For example, in the "x, y" plane, an unconstrained body has the following three degrees of freedom of movement: translation alone the "x" axis, translation along the "y" axis, and rotation about the "z" axis. To be kinematically constrained in a plane (e.g., the "x, y" plane), such a body can have no more than three minus N constraints, where N is the number of degrees of movement the body is to have in the plane. Thus, to be kinematically constrained with no degrees of freedom of movement in a plane, the body can be constrained with no more than three constraints.

Figure 3:
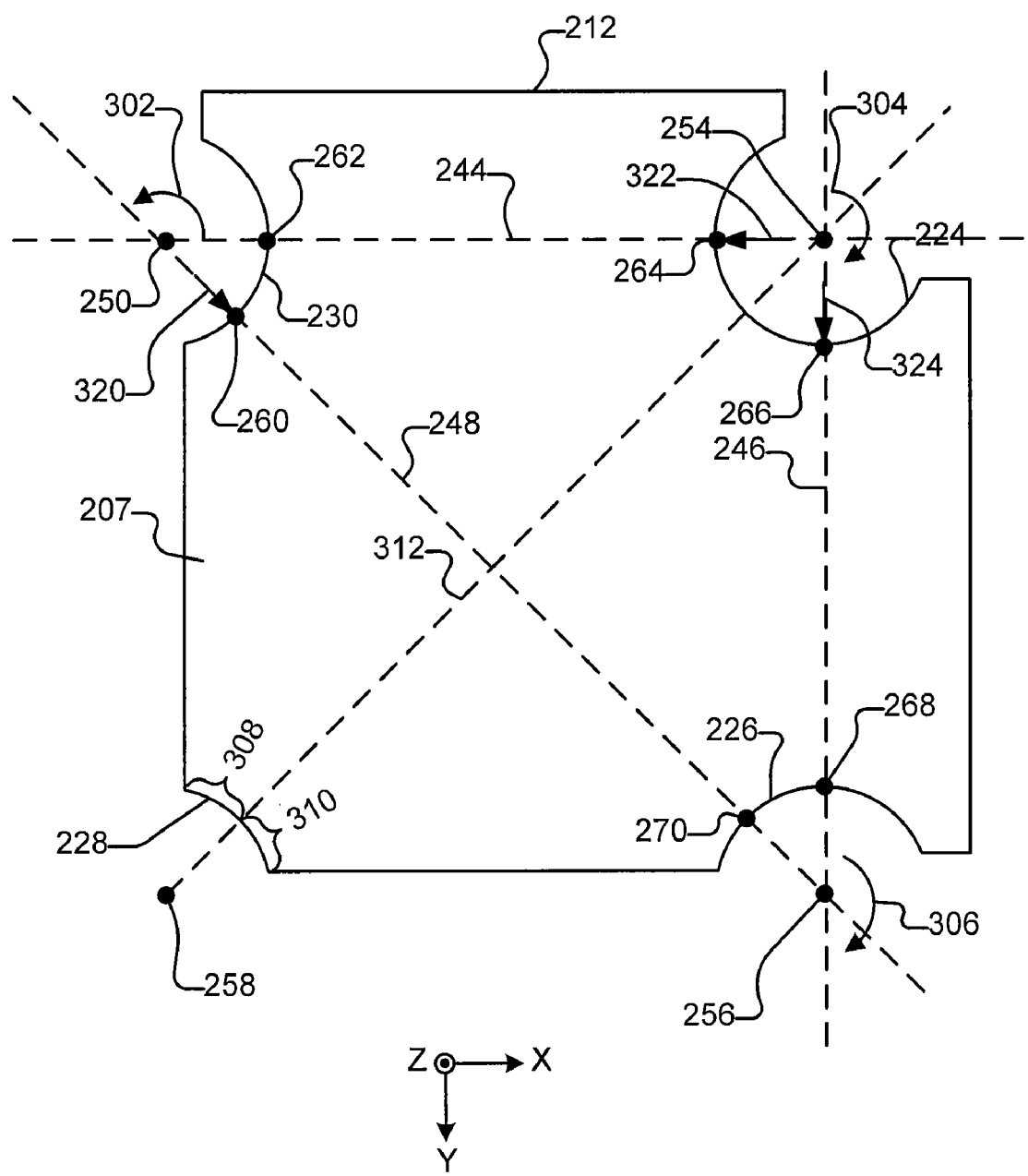
FIG. 3 illustrates exemplary constraints with respect to the first structure of FIG. 1 according to some embodiments of the invention.

As shown in FIG. 2, constraint lines 244, 246, 248 cross the edges 230, 224, 226 at six points (or locations) 260, 262, 264, 266, 268, 270. Three constraints properly placed (e.g., two of the three constraints are not co-linear) at three of the six points 260, 262, 264, 266, 268, 270 can fully constrain movement of the first structure 212 in a two-dimensional plane (the x-y plane in FIG. 2). Because the foregoing utilizes a minimum number of constraints (three) to constrain movement of the first structure 212 in the two-dimensional plane, the foregoing can be a non-limiting example of kinematic constraint of the first structure 212 in the two-dimensional plane. FIG. 3 illustrates an exemplary manner of selecting three of the six points 260, 262, 264, 266, 268, 270 as constraints according to some embodiments of the invention. (As discussed above, an unconstrained body has three degrees of movement in a plane (e.g., translation along the "x" axis, translation along the "y" axis, and rotation about the "z" axis), and such a body is kinematically constrained in the plane with no degrees of movement with three constraints.) In FIG. 3, the first structure 212 is shown with an imaginary line 312 that divides the edge 228 into two portions 308, 310. As will be seen, application of a force in the first portion 308 can cause the first structure 212 to move differently than a force applied to the second portion 310.

Referring first to an example in which a force (not shown) is applied from point 258 to the first portion 308, the first structure 212 can rotate 302 counter clockwise (relative to the page in FIG. 3) about center point 250 if the first structure 212 is configured to rotate about center point 250 but not fixed with respect to center points 254, 256. The first structure 212 can rotate 304 clockwise (relative to the page in FIG. 3) about center point 254 if the first structure 212 is configured to rotate about center point 254 but not fixed with respect to center points 250, 256, and the first structure 212 can rotate 306 clockwise (relative to the page in FIG. 3) about center point 256 if the first structure 212 is configured to rotate about center point 256 but not fixed with respect to center points 250, 254.

As shown in FIG. 3, a constraint 324 directed against the edge 224 at constraint point 266 and oriented along constraint line 246 can stop rotation 302. Similarly, a constraint 320 directed against the edge 230 at constraint point 260 and oriented along constraint line 248 and a constraint 322 directed against edge 224 at constraint point 264 and oriented along constraint line 246 can stop rotation 304 and rotation 306 respectively. Constraints 320, 322, 324 can thus fully constrain movement of the first structure 212 in a two-dimensional plane (e.g., the x-y plane in FIG. 3). The three constraint points 260, 264, 266 are not the only combination of three of the constraint points 260, 262, 264, 266, 268, 270 for placement of constraints 320, 322, 324 that can fully constrain movement of the first structure 212 in a two-dimensional plane. Rather the three constraints 320, 322, 324 can be placed at other combinations of three of the constraint points 260, 262, 264, 266, 268, 270 and fully constrain the first structure 212. For example, constraints 320, 322, 324 can alternatively be placed at constraint points 260, 262, 268. As another non-limiting example, constraints 320, 322, 324 can alternatively be placed at constraint points 264, 268, 270. Moreover, if the force (not shown in FIG. 3) is applied from point 258 to the second portion 310 of the edge 228, the first structure 112 can rotate 302 counter-clockwise about the center point 250 and clockwise 306 about center point 256 as shown in FIG. 3 but can rotate counter clockwise about center point 254 (which is opposite the rotation 304 shown in FIG. 3). Applying the biasing force against the second portion 310 of edge 228 can thus affect the group of three constraint points selected from constraints points 260, 262, 264, 266, 268, 270 as locations for the three constraints 320, 322, 324.

Figure 4:
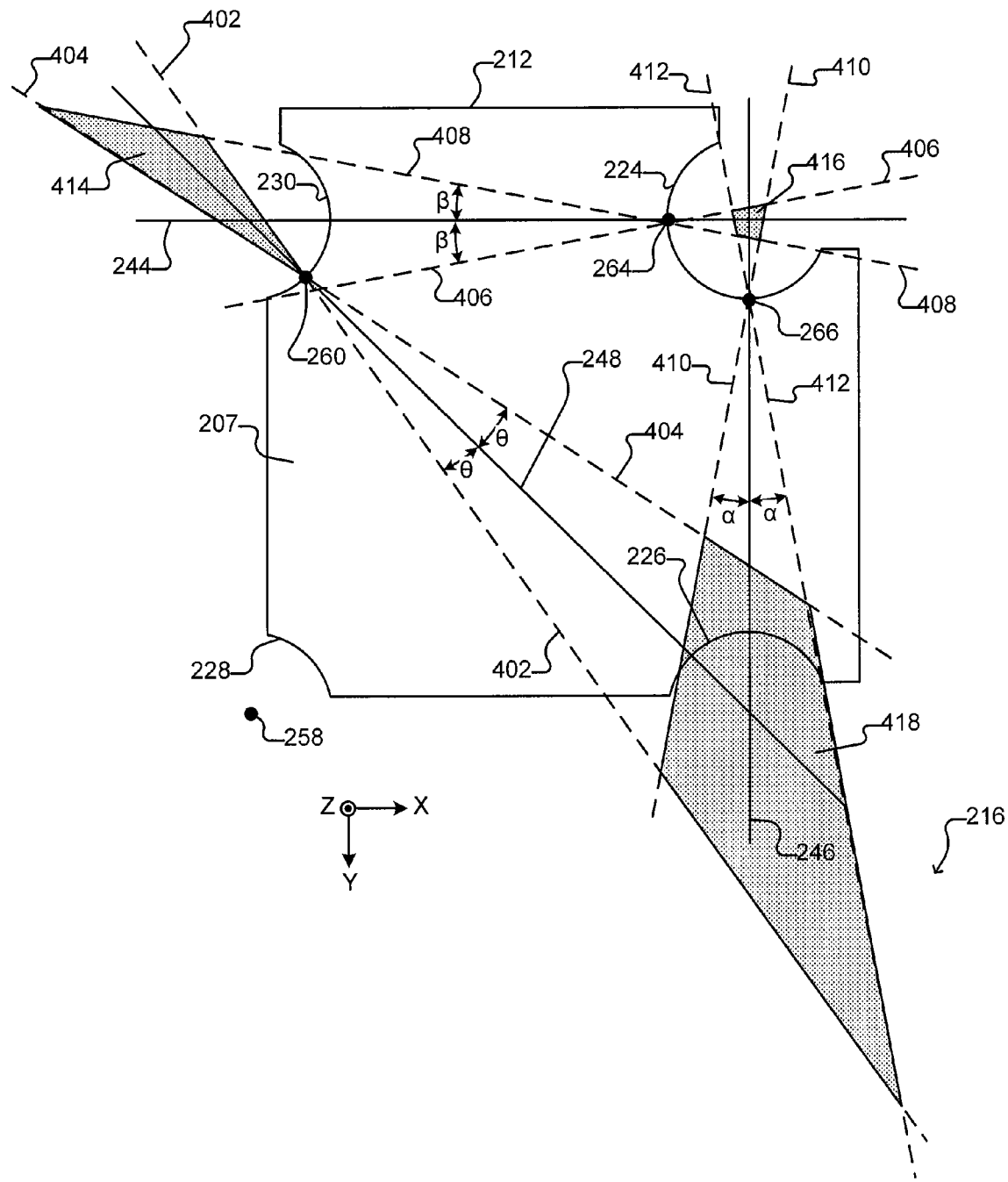
FIG. 4 illustrates exemplary keep out zones with respect to the first structure of FIG. 1 according to some embodiments of the invention.

Continuing with the non-limiting example shown in FIG. 3 in which three constraints 320, 322, 324 are selected as shown in FIG. 3, FIG. 4 illustrates exemplary determination of keep out zones 414, 416, 418 for locating the biasing force (not shown in FIG. 4) to be applied from point 258 to the edge 228 according to some embodiments of the invention. As shown in FIG. 4, a pair of imaginary lines 402, 404 can cross constraint point 260 (which, as discussed above, can be the point at which constraint 320 is applied between the first structure 212 and the second structure 202), and each of the lines 402, 404 can angle from constraint line 248 (the constraint line 248 that corresponds to constraint point 260) by an angle θ (theta). Similarly, a pair of imaginary lines 406, 408 can cross constraint point 264 (which, as discussed above, can be the point at which constraint 322 is applied between the first structure 212 and the second structure 202), and each of the lines 406, 408 can angle from constraint line 244 (the constraint line 244 that corresponds to constraint point 264) by an angle β (beta), and a pair of imaginary lines 410, 412 can cross constraint point 266 (which, as discussed above, can be the point at which constraint 324 is applied between the first structure 212 and the second structure 202), and each of the lines 410, 412 can angle from constraint line 246 (the constraint line 246 that corresponds to constraint point 266) by an angle α (alpha). Keep out zones 414, 416, 418 can be areas enclosed by portions of any four of the lines 402, 404, 406, 408, 410, 412. Put another way, keep out areas 414, 416, 418 can correspond to intersections of areas between two pairs of the line pairs 402/404, 406/408, 410/412. The angles theta θ, beta β, and alpha α can be friction angles, which can be the inverse tangent (the arctangent or $\tan^{-1}$) of the coefficient of friction between the materials that contact one another at constraint locations 320, 322, 324 (see FIG. 3) at the corresponding constraint points 260, 264, 266. For example, theta θ can be the inverse tangent of the coefficient of friction between the materials of the first structure 212 and the second structure 202 that contact each other to form constraint 320 (which, as shown in FIG. 3, can be the constraint 320 at constraint point 260). Similarly, beta β can be the inverse tangent of the coefficient of friction between the materials of the first structure 212 and the second structure 202 that contact each other to form constraint 322 (which, as shown in FIG. 3, can be the constraint 322 at constraint point 264), and alpha α can be the inverse tangent of the coefficient of friction between the materials of the first structure 212 and the second structure 202 that contact each other to form constraint 324 (which, as shown in FIG. 3, can be the constraint 324 at constraint point 266).

Figure 5:
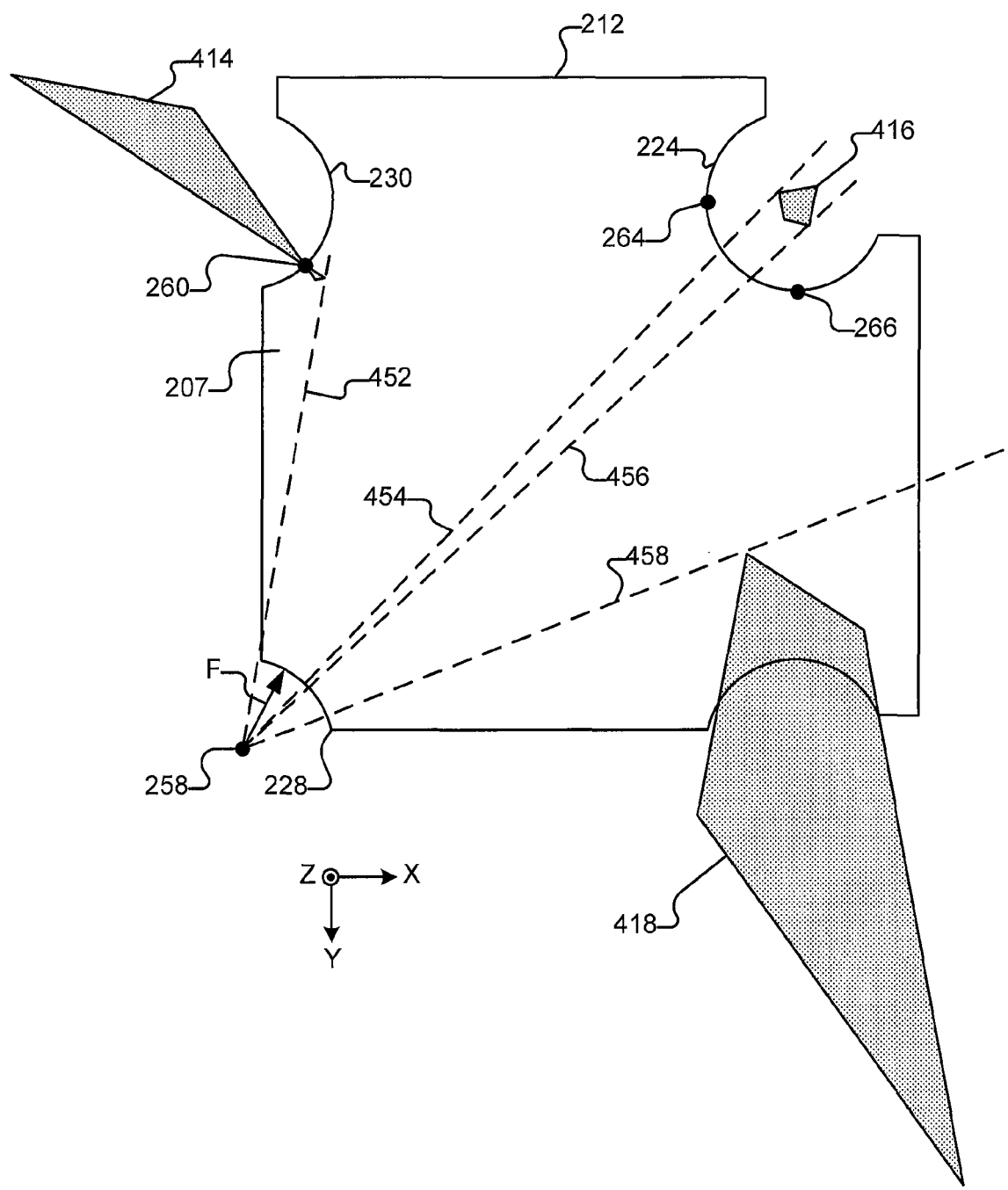
FIG. 5 illustrates exemplary placement of a biasing force that does not cross a keep out zone according to some embodiments of the invention.

As shown in FIG. 5, a biasing force F can be applied from point 258 to edge 228 in a direction that does not cross any of the keep out zones 414, 416, 418. A non-limiting example is shown in FIG. 5, which shows imaginary lines 452, 454 each originating from the point 258. As can be seen, each of lines 452, 454 can pass by an outer point or edge of one of the keep out zones 414, 416. Thus, in the example shown in FIG. 5, the biasing force F can be oriented to point anywhere between lines 452, 454 and not cross a keep out zone 414, 416, 418. Also shown in FIG. 5, are imaginary lines 456, 458, which also originate from point 258 and pass by an outer point or edge of keep out zones 416, 418. In other examples, biasing force F could alternatively be oriented to point anywhere between lines 456, 458 or similar such lines. It is noted, however, that, in the example shown in FIG. 4, constraints 320, 322, 324 (see FIG. 3) can be selected based on an assumption that the biasing force F (see FIG. 4) is applied to the first portion 308 of the edge 228. For this reason, in the non-limiting example shown in FIG. 5, the biasing force F can be oriented in a direction between lines 452, 454 rather than lines 456, 458, which can ensure that the biasing force F tends to impart a rotational bias to the first structure 212 that presses the first structure 212 against constraints 320, 322, 324 such that the first structure 212 is in a predetermined position while constrained by constraints 320, 322, 324.

Figure 6A:
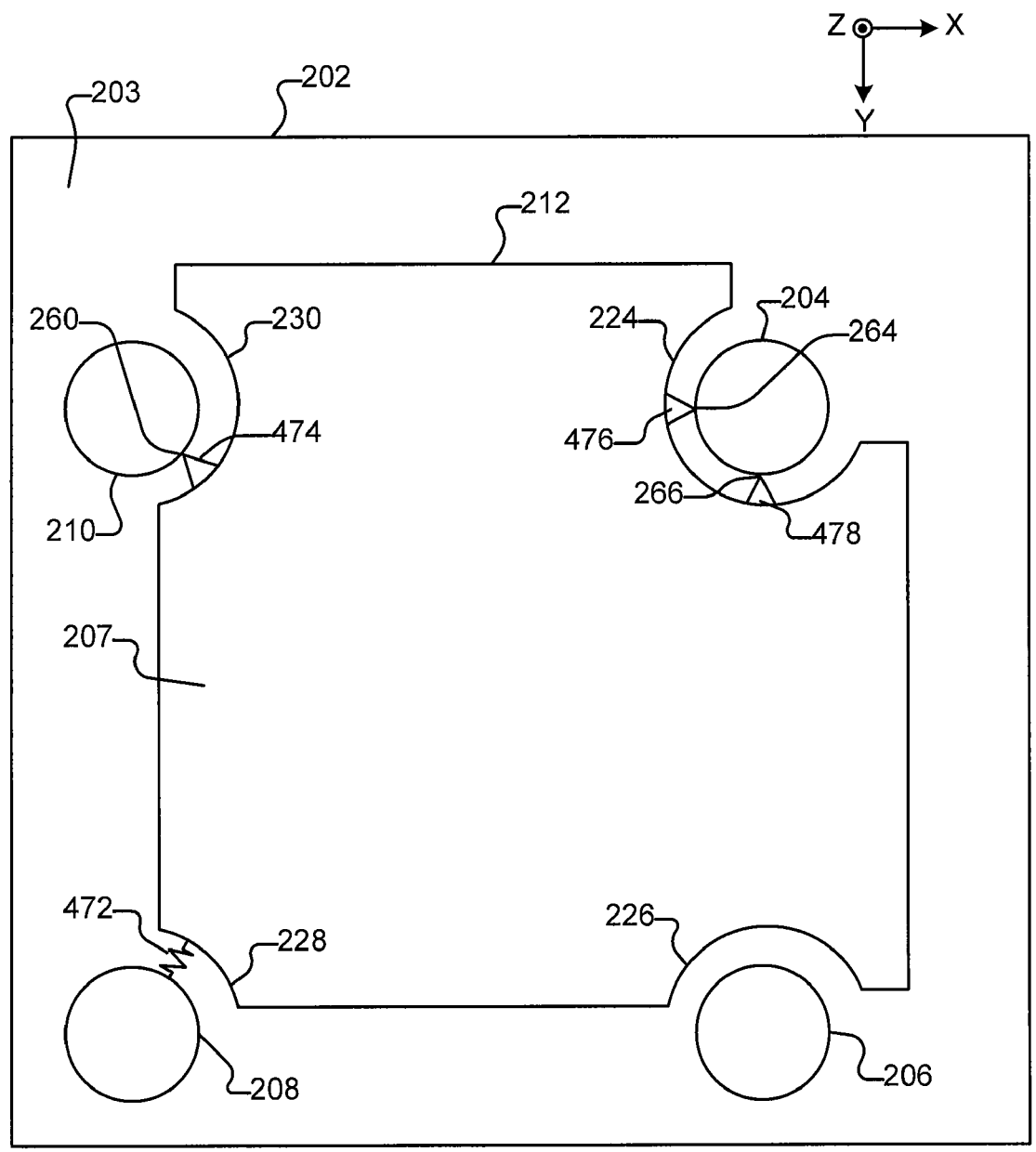
FIG. 6A illustrates exemplary implementations of a biasing force and constraints for positioning the first structure and second structure of FIG. 1 according to some embodiments of the invention.

FIG. 6A shows a top view of the first structure 212 and the second structure 202. In the non-limiting example shown in FIG. 6A, the biasing force F of FIG. 5 can be implemented by a spring 472 compressed between alignment feature 208 of the second structure 202 and the edge 228 of feature 218 of the first structure 212. The spring 472 can be oriented to provide a resulting biasing force F in the direction shown in FIG. 5 (e.g., directed between lines 452, 454 and thus avoiding keep out zones 414, 416, 418). In the example shown in FIG. 6A, constraints 320, 322, 324 (see FIG. 3) can be implemented as bumps or protrusions 474, 476, 478 extending from the first structure 212 and disposed to contact alignment features 204, 210 of the second structure 202 (which as shown in FIG. 1, can be studs that extend from the second structure 202). The protrusions 464, 476, 478 can be integrally formed with the first structure 212 or can be attached to the first structure 212. Alternatively, one or more of protrusions 474, 476, 478 can be integrally formed with or attached to alignment features 204, 210 of the second structure 202. Moreover, although protrusions 474, 476, 478 are shown in FIG. 6A as having a generally triangular shape, other shapes, sizes, etc. of protrusions can be used. For example, protrusions 474, 476, 478 can include a rounded contact area—rather than the pointed contact area shown in FIG. 6A—that contacts one or more alignment features 204, 206, 208, 210 of the second structure 202.

Figure 6B:
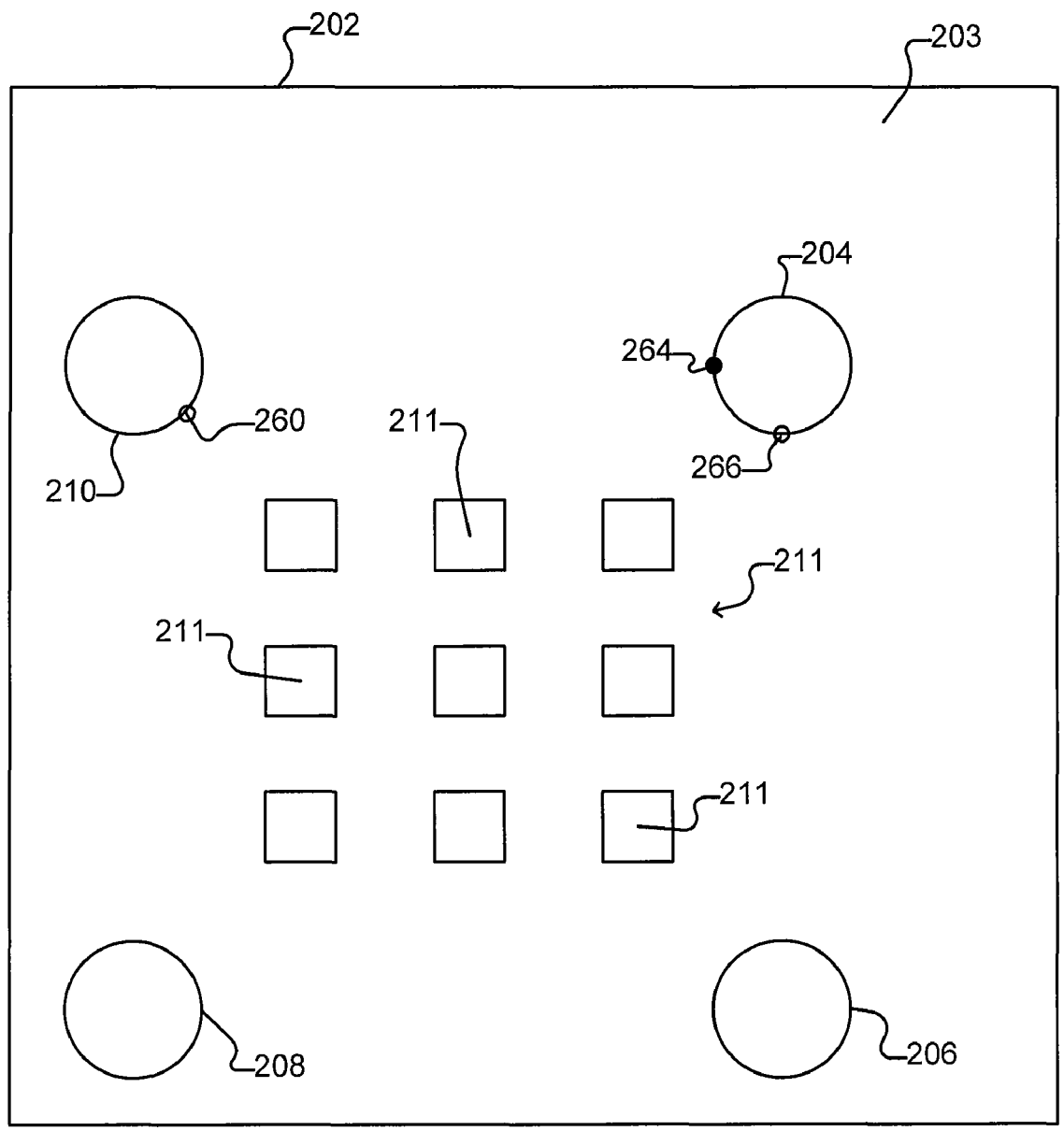
FIG. 6B illustrates a top view of the second structure shown in FIG. 6A.
Figure 6C:
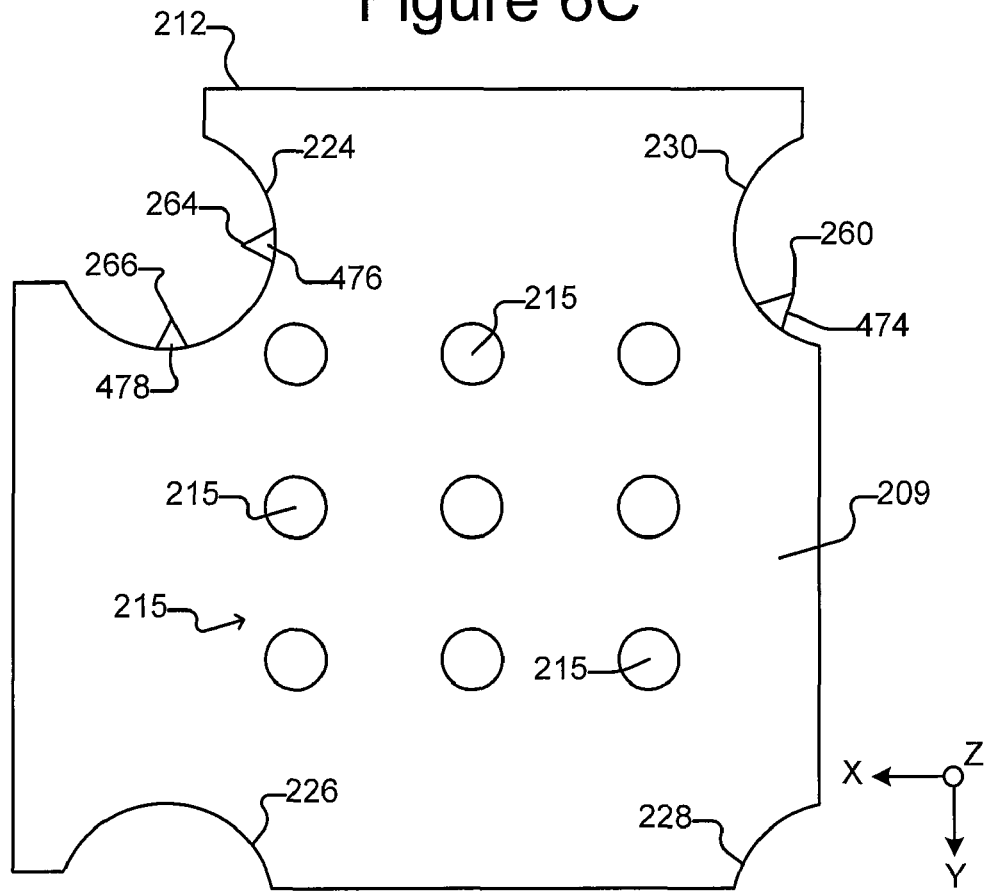
FIG. 6C illustrates a bottom view of the first structure shown in FIG. 6A.
Figure 6D:
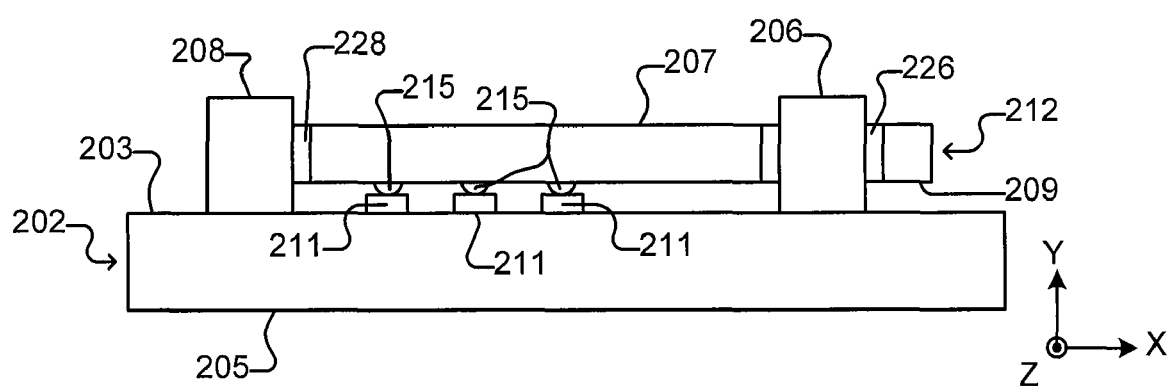
FIG. 6D shows a side view of the first structure and second structure in FIG. 6A.

The points (or areas) where one or more of protrusions 474, 476, 478 contact alignment features 210, 204 can correspond to the constraint points 260, 264, 266. As shown in FIG. 6B, features 211 (e.g., second features) on the second structure 202 can be positioned with a desired precision respect to constraint points 260, 264, 266 on a top surface 203 of the second substrate 202, and as shown in FIG. 6C, corresponding features 215 (e.g., first features) on the first structure 212 can be positioned with respect to the constraint points 260, 264, 266 on a bottom surface 209 of the first structure 212. (Note that FIG. 6B shows a top view of the second substrate 202, while FIG. 6C shows a bottom view of the first substrate 212.) As shown in FIG. 6D (which shows a side view of FIG. 6A), each feature 215 on the bottom surface 209 of the first structure 212 can align with a corresponding feature 211 on the top surface 203 of the second structure 202 while force F (e.g., produced by spring 472) biases the first structure 212 into constraints 320, 322, 324 (e.g., biases protrusions 474, 476, 478 against alignment features 210, 204 on the second structure 202 as shown in FIG. 6A). It should be noted that features 211 can lie in a first plane, and the features 215 can lie in a second plane that is generally parallel to the first plane.

The features 211 and the features 215 can be any type of features that are to be aligned one with another. For example, the features 211 can comprise a first set of electrical contacts, terminals, connections, etc. The features 215 can comprise a second set of electrical contacts, terminals, connections, etc. that are to be aligned with and connected to the first set of electrical contacts, terminals, connections, etc.

In some embodiments, the sizes or lengths of one or more of protrusions 474, 476, 478 can be independently adjustable. For example, in some embodiments, protrusions 474, 476, 478 can be made somewhat oversized and then part of one or more of protrusions 474, 476, 478 can be removed to reduce their sizes or lengths to correspond to a particular application or use. For example, material can be removed from protrusions 474, 476, 478 by machining or otherwise trimming the one or more protrusions 474, 476, 478. Alternatively, material can be added to one or more of protrusions 474, 476, 478 to lengthen or increase the size of the respective protrusion 474, 476, 478. As yet another example, the effective length of one or more of protrusions 474, 476, 478 can be increased by putting an object (e.g., a shim) between one or more of protrusions 474, 476, 478 and one or more alignment features 204, 210, respectively.

Figure 7:
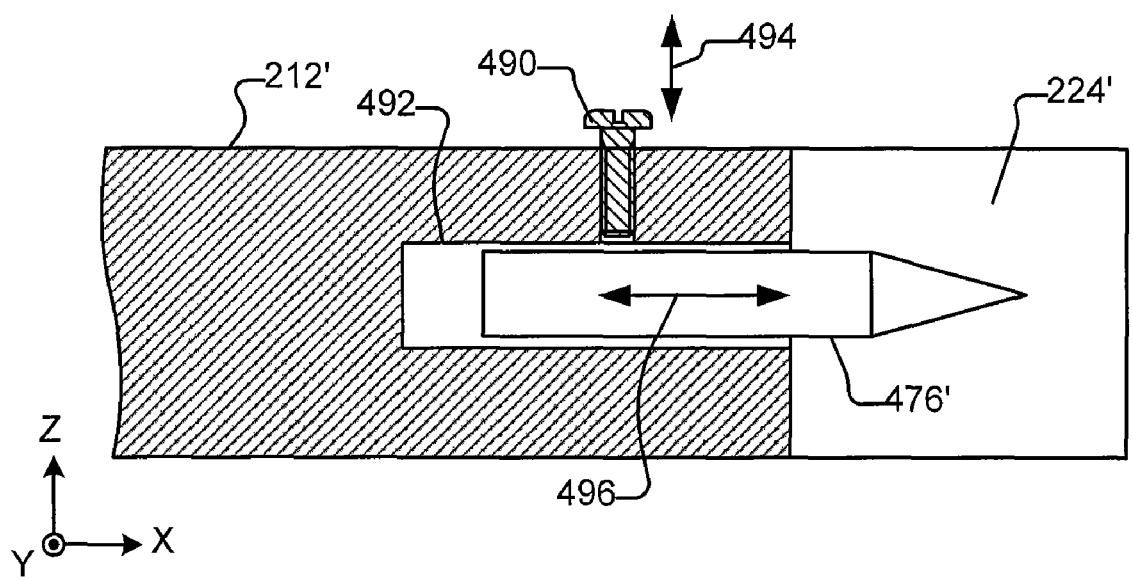
FIG. 7 illustrates an exemplary adjustable constraint according to some embodiments of the invention.

FIG. 7 illustrates another example in which the effective length of one or more of protrusions (e.g., like protrusions 474, 476, 478) can be changed according to some embodiments of the invention. FIG. 7 illustrates a partial, cross-sectional view of a modified first structure 212', which can, as shown, include a cavity 492 and locking mechanism 490 (e.g., a screw). The partial view of modified first structure 212' shown in FIG. 7 includes an edge 224', which can be generally similar to edge 224 in FIGS. 1-6. As shown, protrusion 476' (which can be generally similar to and generally located in the same place as protrusion 476 of FIG. 6A) can extend into the cavity 492. While locking mechanism 490 is in a locking position (e.g., tightened against protrusion 476'), the protrusion 476' can be held firmly in place and generally be immovable. While locking mechanism 490 is in an unlocked position (e.g., loosed and therefore not pressed firmly against the protrusion 476'), protrusion 476' can be free to slide back and forth as indicated by arrow 496. In this way, the length of the protrusion 476' that extends from edge 224' can be adjusted for particular applications. The effective length of one or more of the protrusions 474, 476, 478 shown in FIG. 6A can be adjustable, for example, like protrusion 476'.

Whether one or more of protrusions 474, 476, 478 are adjustable or not, such protrusions can alternatively be part of or attached to one or more of the alignment features 204, 206, 208, 210 of the second structure 202. For example, protrusion 474 can alternatively extend from alignment feature 210 (e.g., with a contact end extending outward from the alignment feature 210) toward edge 230, and edge 230 of the first structure 212 can be biased by the biasing force of spring 472 into contact with the protrusion 474. Protrusions 476, 478 can similarly extend from alignment feature 204, and edge 224 of the first structure 212 can be biased into contact with the protrusions 476, 478.

Speaking generally, as should be apparent, the first structure 212 can be positioned to a desired location with respect to the second structure 202 by applying a properly oriented biasing force (e.g., force F in FIG. 5) to the first structure 212 and specifically locating constraints (e.g., constraints 320, 322, 324 in FIG. 3). For example, the positions, shapes, sizes, etc. of one or more of the alignment features 204, 206, 208, 210 on the second structure 202 and the positions, shapes, sizes, etc. of one or more of protrusions 474, 476, 478 can be made and located so that, while the biasing force of spring 472 forces one or more of protrusions 474, 476, 478 against the alignment features 204, 210, the first structure 212 is in a predetermined position (or alignment) with respect to the second structure 202.

The processes and apparatuses shown in FIGS. 1-7 are exemplary only, and many variations are possible. For example, biasing force F, which is illustrated in FIG. 5 as a force that pushes on the first structure 212, can be replaced with or augmented by a force that pulls on the first structure 212. For example, biasing force F in FIG. 5 can be replaced with or augmented by a force (not shown) that pulls on edge 224. Such a pulling force can be applied to edge 224 by a spring (e.g., like spring 472) in tension between edge 224 and alignment feature 204 (see FIG. 6). As another example of modifications to the processes and apparatuses of FIGS. 1-7, biasing force F can represent the vector sum of a plurality of forces applied to one or more of the edges 224, 226, 228, 230 of the first structure 212. As yet another example of modifications to the configurations shown in FIGS. 1-7, biasing force F (or multiple forces of which biasing force F represents a vector sum) can be applied to features of the first structure 212 other than edges 224, 226, 228, 230. Still other non-limiting modifications include aligning the first structure 212 to features on the second structure 202 other than alignment features 204, 206, 208, 210. Other exemplary modifications include applying biasing force F to another of the edges 226, 230, 232 and locating constraints 320, 322, 324 and constraint points 260, 264, 266 at locations on one or more of edges 226, 228, 230, 232 other than the locations (e.g., points 262, 268, 270 in FIG. 3) shown in FIG. 3. Moreover, mechanisms other than a spring can be used to generate biasing force F. Indeed, any mechanism can be used to generate biasing force F.

Figure 8:
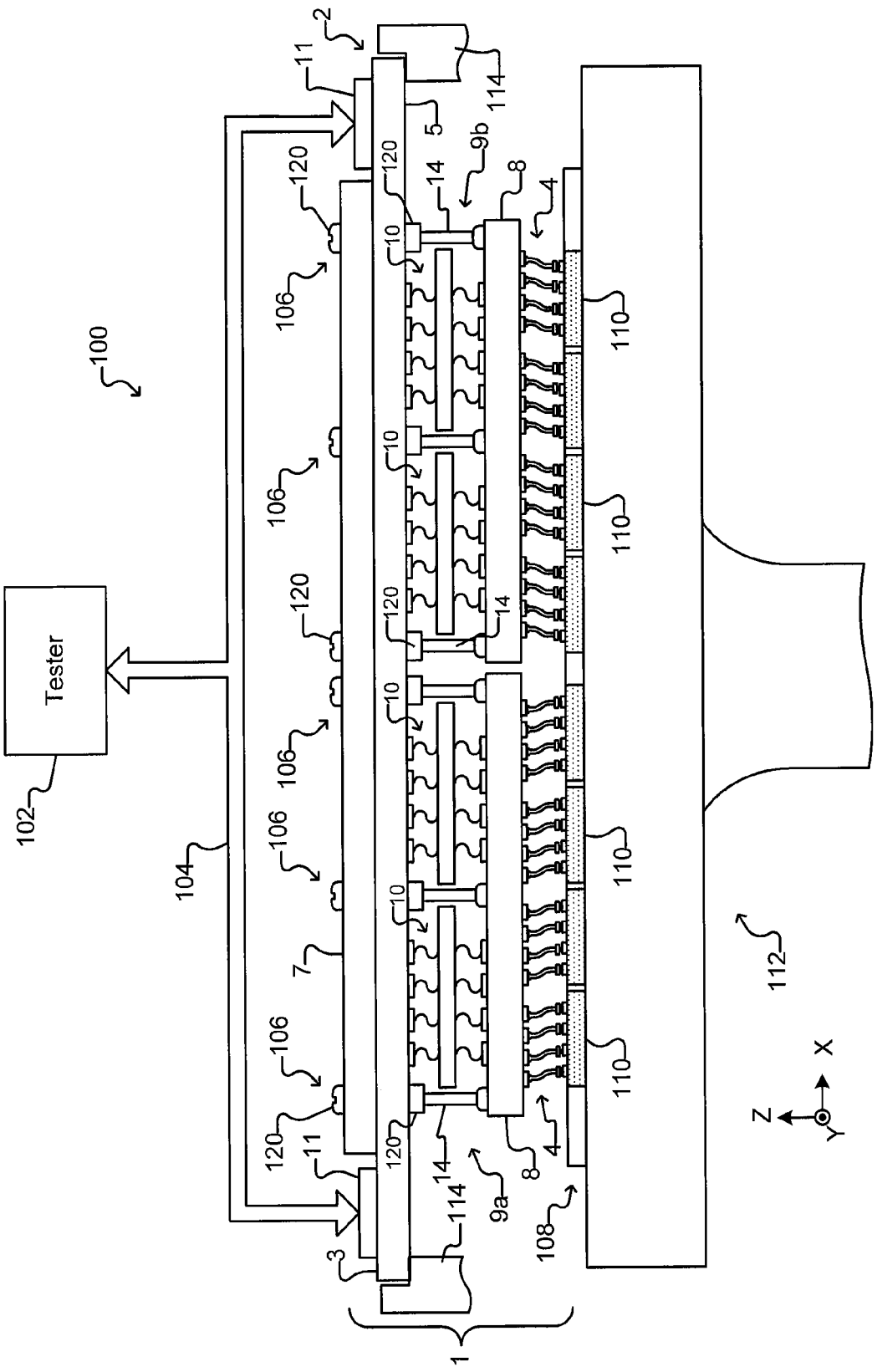
FIG. 8 is a schematic view of an exemplary test system, which includes an exemplary probe card assembly shown in side view, according to some embodiments of the invention.

There are many possible applications for the exemplary alignment techniques illustrated in FIGS. 1-7 and discussed above. One such application can be aligning components in a probe card assembly, which can be used in a system for testing electronic devices, such as semiconductor dies. FIGS. 8-19 illustrate some examples according to some embodiments of the invention. FIG. 8 illustrates a non-limiting exemplary test system 100, and FIGS. 9-13 illustrate a non-limiting exemplary probe card assembly of the test system 100 of FIG. 8. FIGS. 14-19 illustrate exemplary alignment of interposers of the probe card assembly 1 according to some embodiments of the invention.

FIG. 8 shows a side, simplified schematic view of an exemplary test system 100 according to some embodiments of the invention. As shown, the test system 100 can include a tester 102, a plurality of communications channels 104, a probe card assembly 1, and a chuck (or stage) 112 for supporting and moving electronic devices under test ("DUTs") 110. Although four DUTs 110 are shown, more or fewer can be tested. Also, although DUTs 110 are illustrated in FIG. 8 as semiconductor dies of a semiconductor wafer 108, DUTs 110 can alternatively be other types of electronic devices. Examples of DUTs 110 include any type of electronic device that is to be tested, including without limitation one or more dies of an unsingulated semiconductor wafer 108 (as shown in FIG. 8), one or more semiconductor dies singulated from a wafer (packaged or unpackaged), an array of singulated semiconductor dies (packaged or unpackaged) disposed in a carrier or other holding device, one or more multi-die electronics modules, one or more printed circuit boards, or any other type of electronic device or devices. Note that the term DUT, as used herein, refers to one or a plurality of such electronic devices.

The tester 102 can comprise a computer or computers and/or other electronic elements configured to control testing of DUTs 110. The communications channels 104 can provide electrical communications between the tester 102 and the probe card assembly 1. The communications channels 104 can comprise any media over which electronic, optical, or other types of signals can be communicated. Non-limiting examples include coaxial cables, fiber optic links, wireless transmitters/receives, drivers, receivers, etc. or any combination of the foregoing. A communications channel 104 can be provided for each input and output of a DUT 110 that is to be tested. Power, ground, and input signals for testing a DUT 110 can be provided to DUTs 110 from the tester 102 through ones of the communications channels 104 and the probe card assembly 1, and response signals generated by the DUTs 110 can be provided to the tester 102 through the probe card assembly 1 and other communications channels 104.

Figure 9:
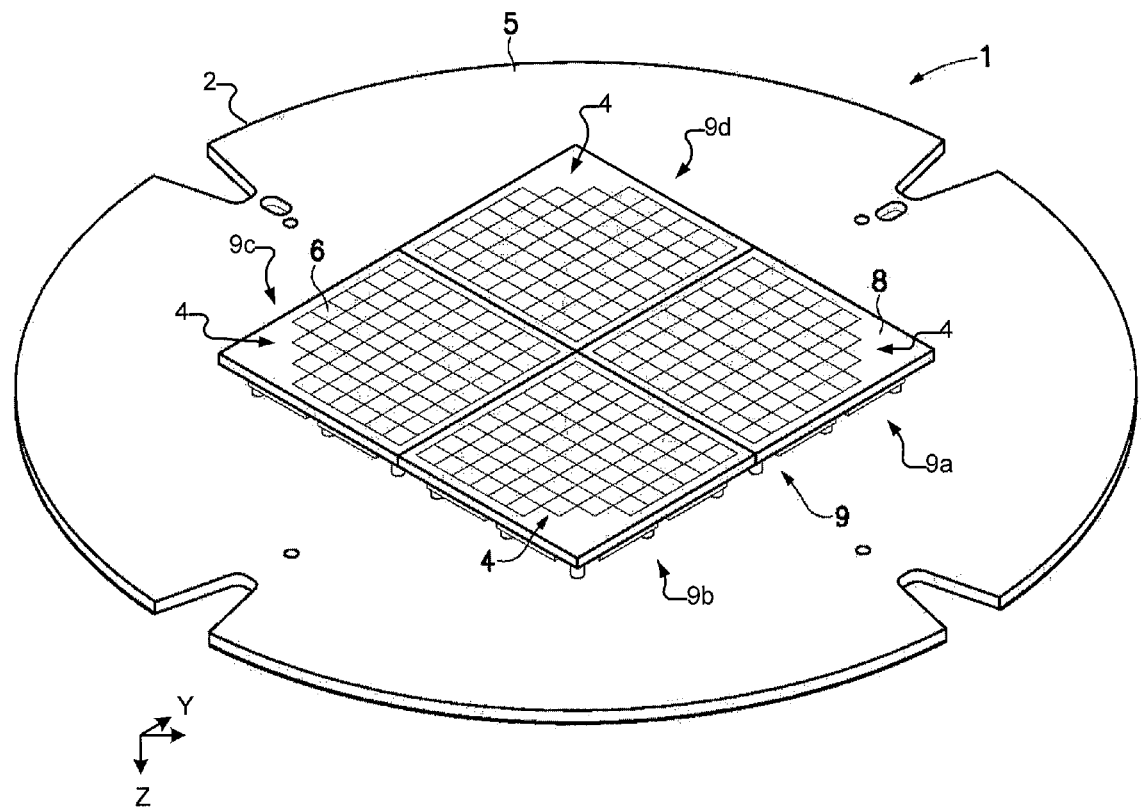
FIG. 9 is a perspective bottom view of an exemplary probe card assembly according to some embodiments of the invention.
Figure 10:
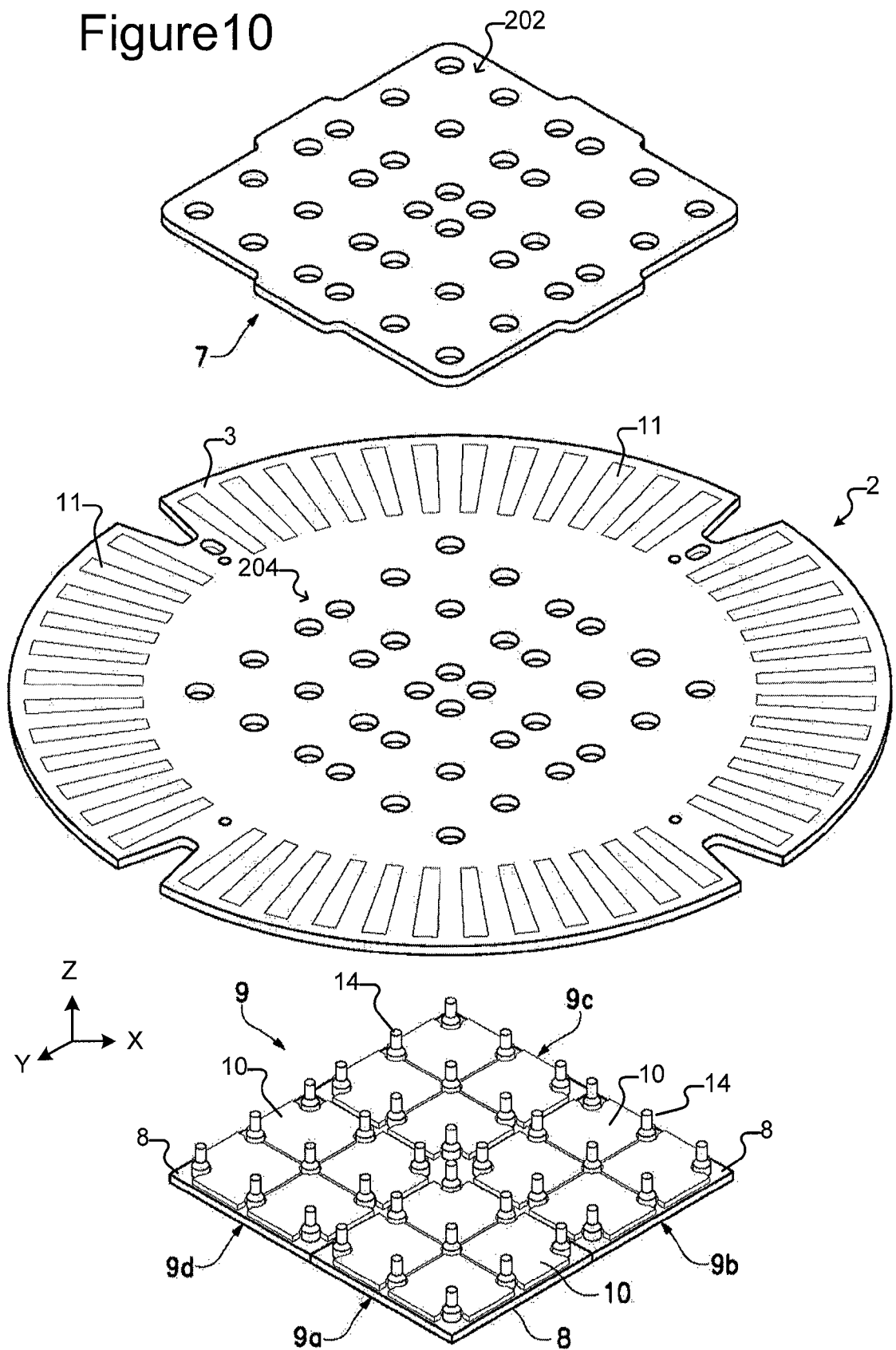
FIG. 10 is an exploded perspective top view of portions of the probe card assembly of FIG. 9.

The probe card assembly 1 can include a wiring substrate 2 and electrical connectors 11 having individual connections to the channels 104 can be disposed on an upper surface 3 of the wiring substrate 2. The probe card assembly 1 can also include electrically conductive probes 4, which can be configured to be pressed against and thus make electrical connections with input and/or output terminals of DUTs 110. The probe card assembly 1 can include electrically conductive paths (not shown) from the electrical connectors 11 to a lower surface 5 of the wiring substrate 2 and thus to one or more probe head assemblies 9a, 9b (two are shown in FIG. 8, and four are shown in FIGS. 9 and 10, but more or fewer than two or four can be used) in contact with the lower surface 5 of the wiring substrate 2. The conductive paths (not shown) between the electrical connectors 11 and the lower surface 5 of the wiring substrate 2, and thus the probe head assemblies 9a, 9b, can comprise electrically conductive traces, vias, and/or terminals (not shown) on and/or in the wiring substrate 2. As will be discussed in more detail below, ones of the probes 4 can be attached to each probe head assembly 9a and/or 9b, and each probe head assembly 9a, 9b can provide electrical paths between the paths (not shown) of the wiring substrate 2 and probes 4 on the probe head assembly 9a, 9b. The probe card assembly 1 can thus provide electrical paths (not shown) between the electrical connectors 104 (and thus individual ones of the channels 104) and ones of the probes 4. The probe card assembly 1 can thus provide an electrical interface between communications channels 104 and input and/or output terminals of DUTs 110.

The probes 4 can be any type of electrically conductive probe, including without limitation needle probes, buckling beam probes, bump probes, or spring probes. The probes 4 can be resilient, conductive structures. Non-limiting examples of suitable probes 4 include composite structures formed of a core wire that is over coated with a resilient material as described in U.S. Pat. No. 5,476,211, U.S. Pat. No. 5,917,707, and U.S. Pat. No. 6,336,269. The probes 4 can alternatively be lithographically formed structures, such as the spring elements disclosed in U.S. Pat. No. 5,994,152, U.S. Pat. No. 6,033,935, U.S. Pat. No. 6,255,126, U.S. patent Application Publication No. 2001/0044225, and U.S. patent Application Publication No. 2001/0012739. Other non-limiting examples of probes 4 include those disclosed in U.S. Pat. No. 6,827,584, U.S. Pat. No. 6,640,432, and U.S. patent Publication No. 2001/0012739. Pogo pins, buckling beam probes (e.g., cobra probes), and other types of probes may also be used. Also, regardless of probe type, the probe tip can be in the shape of a pyramid, truncated pyramid, blade, bump, or any other suitable shape. Non-limiting examples of various shapes and sizes of suitable probe tips are described in U.S. Pat. No. 6,441,315.

The test system 100 can test DUTs 110 as follows. As shown in FIG. 8, DUTs 110 can be placed on a chuck 112, which can be moveable, and the probe card assembly 1 can be attached (e.g., bolted, clamped, etc.) to a mounting structure 114 associated with a housing or other apparatus (not shown) in which the chuck 112 is disposed. The chuck 112 can move terminals of the DUTs 110 into contact with probes 4 as shown in FIG. 8. Alternatively or additionally, the probe card assembly 1 can be moved to effect contact between terminals of the DUTs 110 and probes 4. The tester 102 can generate patterns of test signals, which can be provided through the channels 104 and probe card assembly 1 to the DUTs 110. Response signals generated by the DUTs 110 in response to the test signals can be provided through the probe card assembly 1 and channels 104 to the tester 102, which can evaluate the response signals and determine whether the response signals are as expected and, consequently, whether the DUTs 110 passed the testing. (As used herein, the term "test signals" can refer to the signals input into the DUTs and/or to the response signals generated by the DUTs.)

The exemplary probe card assembly 1 will now be described with reference to FIGS. 8-10. FIG. 8 includes a side view of the probe card assembly 1, and FIG. 9 shows a bottom, perspective view of the probe card assembly 1. FIG. 10 shows an exploded view of some of the components of the probe card assembly 1. As discussed above, and as shown in FIGS. 8-10, the probe card assembly 1 can comprise a wiring substrate 2 with an upper surface 3 and a lower surface 5, a stiffener plate 7 (not visible in FIG. 9), a plurality of independent probe head assemblies 9a, 9b, 9c, 9d, and attachment mechanisms 106 for attaching the probe head assemblies 9a, 9b, 9c, 9d to the stiffener plate 7 and the wiring substrate 2.

The wiring substrate 2 can comprise any substrate suitable for supporting electrical connectors 11 (not visible in FIG. 9) and providing electrical paths (not shown) to and from the connectors 11. For example, the wiring substrate 2 can comprise a printed circuit board. The electrical connectors 11 can comprise any electrical connector suitable for making electrical connections with the channels 104. For example, electrical connectors can comprise pogo pin pads, zero-insertion-force (ZIF) connectors, etc.

The stiffener plate 7 can be configured to assist in resisting movement, warping, bending, etc. during testing of the DUTs 110 caused by, for example, changes in ambient temperature, temperature gradients, mechanical loads, etc. The stiffener plate 7 can comprise any rigid structure. For example, the stiffener plate 7 can comprise a metal plate.

As shown in FIGS. 8-10, the probe head assemblies 9a, 9b, 9c, 9d can be positioned such that probes 4 of each probe head assembly 9a, 9b, 9c, 9d form a large array 9 of probes 4 for simultaneously contacting numerous DUTs 110. The pattern of probes 4 in the array 9 need not be a regular or repeating pattern. Typically the pattern of probes 4 in the array 9 can correspond to a pattern of terminals of the DUTs 110. Moreover, although four probe head assemblies 9a, 9b, 9c, 9d are shown in FIGS. 9 and 10, more or fewer can be used.

As best seen in FIG. 8, attachment mechanisms 106 can attach the probe head assemblies 9a, 9b, 9c, 9d to the stiffener plate 7. The attachment mechanisms 106 can comprise a plurality of studs 14, which can be attached to probe substrates 8 of the probe head assemblies 9a, 9b, 9c, 9d. The studs 14, which can be threaded, can extend upwardly from each probe substrate 8 (see FIGS. 8 and 10) and can engage threaded fasteners 120 that extend from the stiffener plate 7 through holes 202 in the stiffener plate 7 and holes 204 in the wiring substrate 2 (see FIGS. 1 and 3). The attachment mechanisms can, for example, comprise differential screw assemblies.

The attachment mechanisms 106 can perform functions other than attaching the probe head assemblies 9a, 9b, 9c, 9d to the stiffener plate 7. For example, the attachment mechanism 106 can be configured to selectively adjust an orientation of the surface of the probe substrate 8 to which the probes 4 are attached. For example, the attachment mechanisms 106 can be configured to apply selectively push or pull forces to various locations on the probe substrate 8 and thereby selectively alter a position (e.g., an orientation) of a probe substrate 8 with respect to the stiffener plate 7 (and/or the wiring substrate 2) or even alter a shape of the surface of the probe substrate 8 to which the probes 4 are attached. Examples of such attachment mechanisms are disclosed in U.S. Pat. No. 6,509,751. As will be seen, interposers 10 can provide compliant electrical connections between the wiring substrate 2 and the probe substrates 8 even as an orientation of a probe substrate 8 is changed as described above.

Other mechanisms (not shown) can be provided to attach or adjust the probe head assemblies 9a, 9b, 9c, 9d. For example, mechanisms (not shown) can be provided to adjust individually a position of each of probe head assemblies 9a, 9b, 9c, 9d, and thus the probes 4 of each of probe head assemblies 9a, 9b, 9c, 9d. Non-limiting examples of such mechanism are disclosed in U.S. patent application Ser. No. 11/165,833.

Each of probe head assemblies 9a, 9b, 9c, 9d can comprise a probe substrate 8, and as best seen in FIG. 9, probes 4 can be attached to a lower surface of each probe substrate 8. The probes 4 on each probe substrate 8 can be organized into probe groups 6. In FIG. 9, each probe group 6 is represented by a square, and individual probes 4 are not shown. Each probe group 6 can include, for example, a number of probes 4 arranged in a pattern for contacting one of the DUTs 110. The number and pattern of probes 4 in a group can thus depend on the number of input and/or output terminals of each DUT 110. In some examples, a probe group 6 can include sixty to eighty or more probes 4. In other examples, a probe group 6 can include fewer or more probes 4. Because the DUTs 110 are typically identical to one another, the probe groups 6 can be identical to one another.

Figure 11:
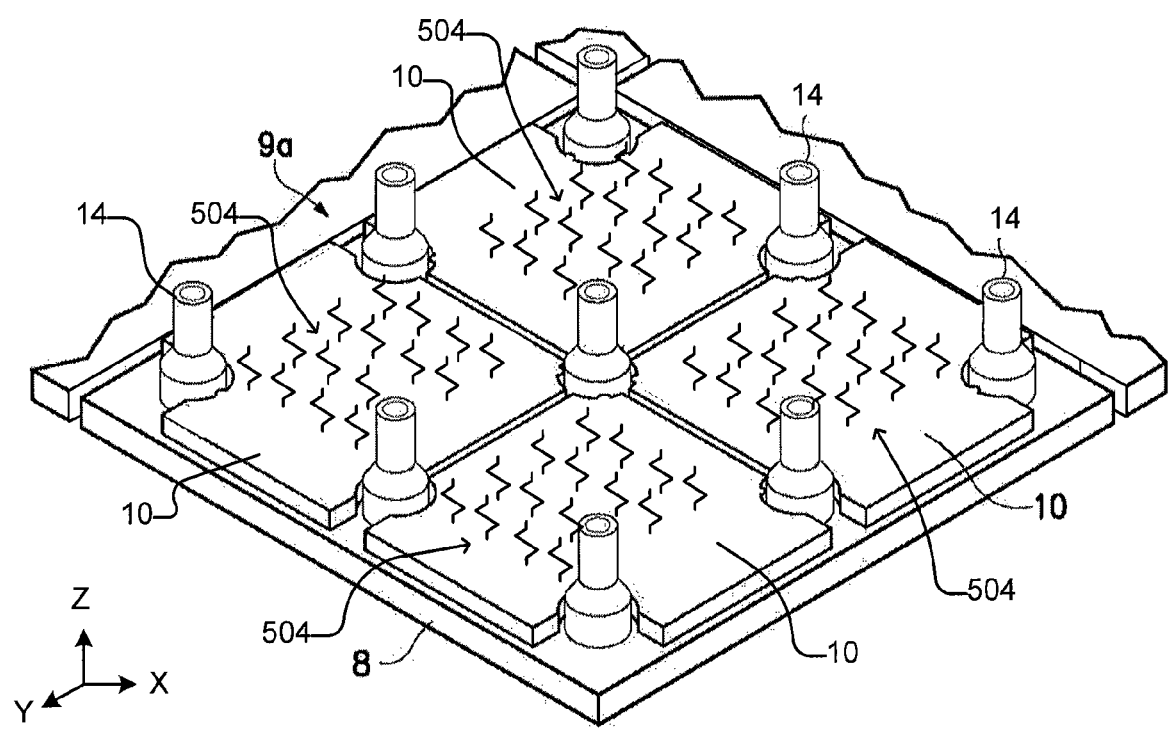
FIG. 11 is a top perspective view of one of the probe head assemblies of the probe card assembly of FIG. 9.

FIG. 11 shows a top perspective view of one probe head assembly 9a. Probe head assemblies 9b, 9c, 9d can be generally the same as or similar to probe head assembly 9a. Indeed, the probe head assemblies 9a, 9b, 9c, 9d can be modules that are readily replaced. Thus, during the life of the probe card assembly 1, one or more of the probe head assemblies 9a, 9b, 9c, 9d can be removed and replaced with a new probe head assembly. For example, this can be done to replace a broken, damaged, or malfunctioning probe head assembly. As another example, this can be done to provide probes 4 disposed in a new pattern.

As will be seen, the probe head assembly 9a can comprise a probe substrate 8 to which ones of the probes 4 (not visible in FIG. 11) are attached. The probe head assembly 9a can also comprise a plurality of interposers 10 configured to provide electrical connections between the wiring substrate 2 and the probe substrate 8. Although four interposers 10 are shown in FIG. 11, more or fewer interposers 10 can be used.

Figure 12:
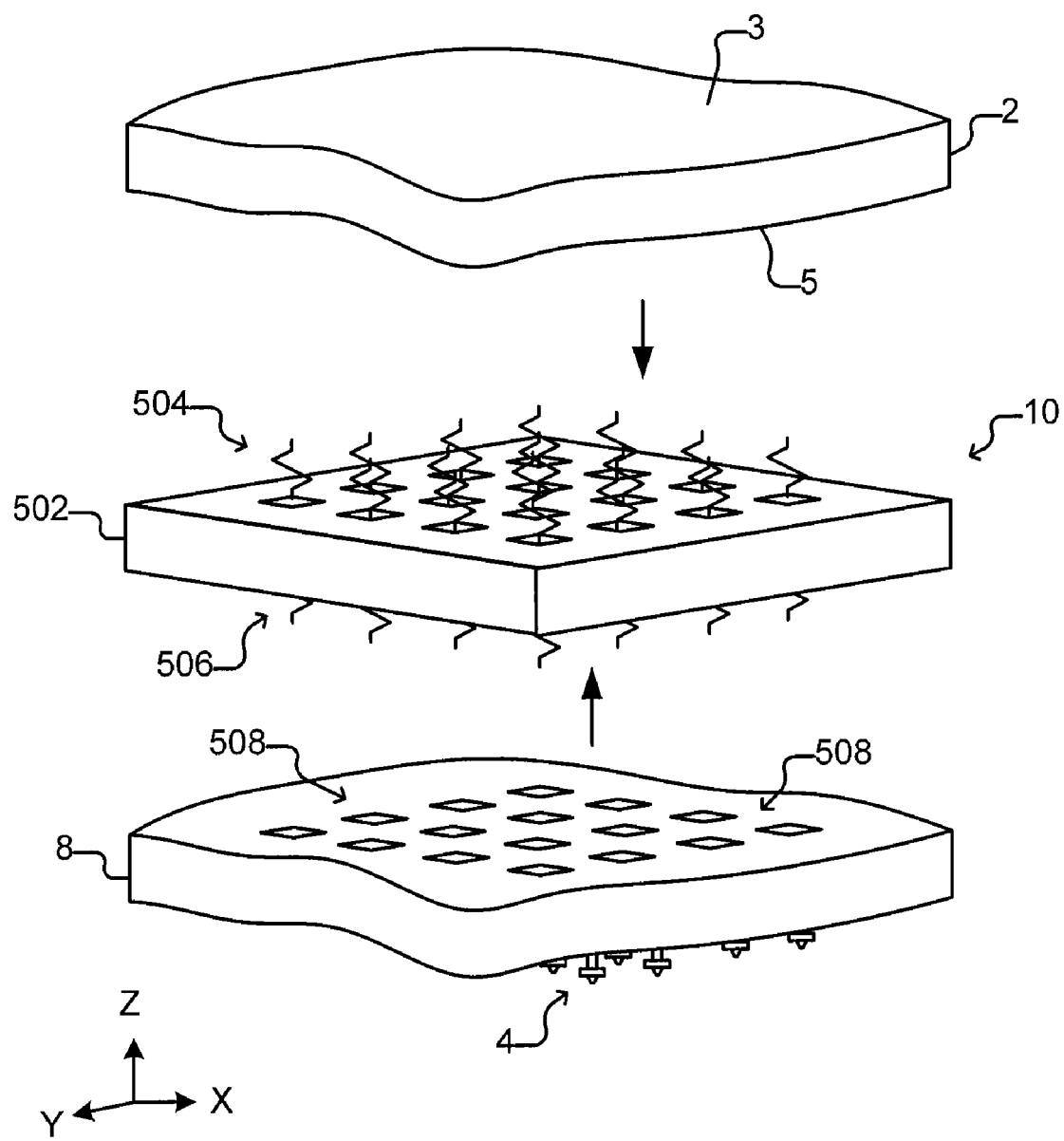
FIG. 12 is a top perspective, exploded view of one of the interposers and partial views of the wiring substrate and probe substrate of the probe head assembly of FIG. 12.
Figure 13:
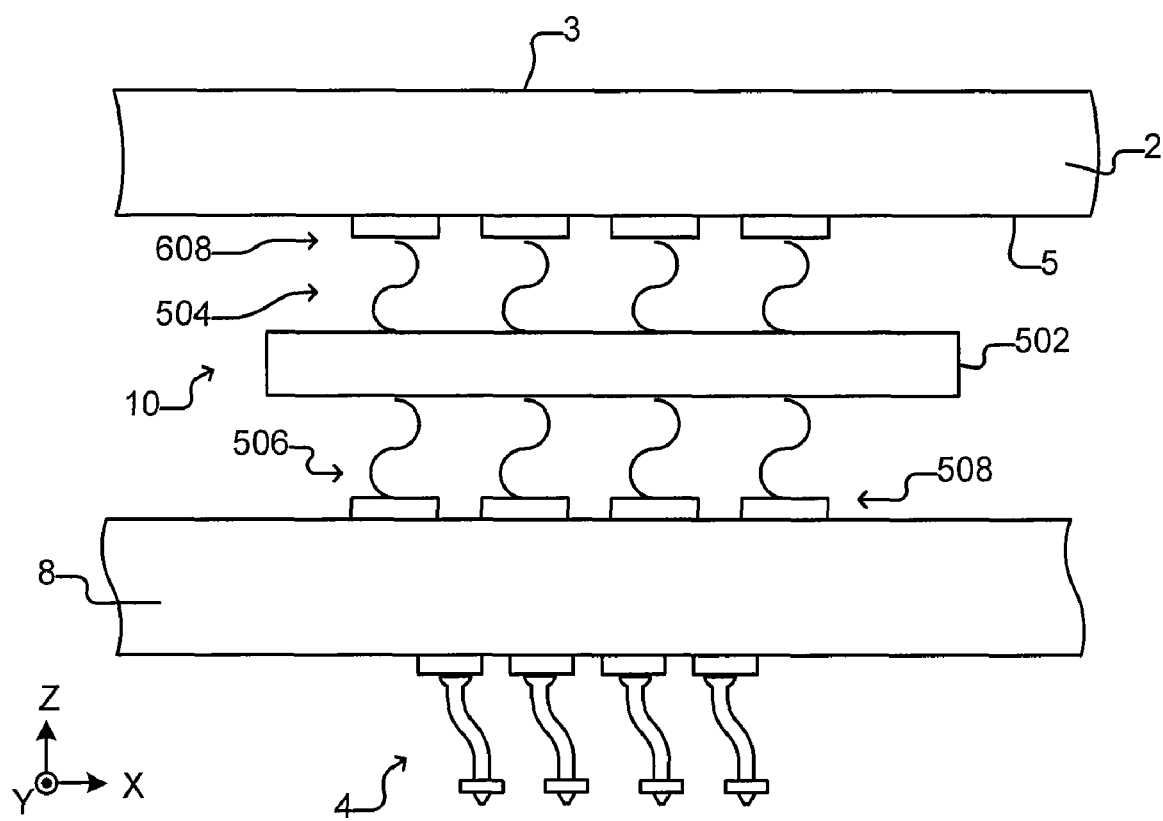
FIG. 13 is an assembled, side view of the interposer and partial views of the wiring substrate and probe substrate shown in FIG. 12.

FIG. 12 shows a top perspective, exploded view of one interposer 10 and partial views of the wiring substrate 2 and the probe substrate 8 of the probe head assembly 9a of FIG. 11, and FIG. 13 shows a side view of the wiring substrate 2, interposer 10, and probe substrate 8 of FIG. 12, illustrating exemplary interconnection of the interposer 10 to the wiring substrate 2 and probe substrate 8. As shown in FIGS. 11-13, each interposer 10 (which can be a non-limiting example of a compliant interconnect) can comprise an interposer substrate 502 (e.g., a ceramic, semiconductor, printed circuit board, etc. material) with a first plurality of elongate, resilient electrical contacts 504 extending from a one surface of the substrate 502 and a second plurality of elongate, resilient electrical contacts 506 extending from an opposite surface of the substrate 502. The electrical contacts 504, 506 can be spring-like probes and can be, for example, like any of the exemplary structures described above with respect to probes 4. The substrate 502 can comprise electrical paths (not shown) through the substrate 502 electrically connecting ones of the contacts 504 with ones of the contacts 506. Such electrical paths (not shown) can comprise electrically conductive terminals, vias, and/or traces (not shown) on and/or in the substrate 502. Alternatively, the elongate, resilient electrical contacts 504 and/or 506 can extend through the substrate 502.

As shown in FIGS. 12 and 13, the contacts 504 can align with electrically conductive terminals 608 (see FIG. 13) on the bottom surface 5 of the wiring substrate 2, and contacts 506 can align with electrically conductive terminals 508 on the probe substrate 8. The interposer 10 can thus provide flexible or compliant electrical connections between ones of the terminals 608 on the wiring substrate 2 and ones of the terminals 508 on the probe substrate 8. In accordance with the discussion above, the wiring substrate 2 can comprise electrical paths (not shown) between the electrical connectors 11 (see FIG. 8) and the terminals 608, and the probe substrate 8 can comprise electrical paths (not shown) between the terminals 508 and probes 4. Each of the interposers 10 of probe head assembly 9a can be like the interposer 10 shown in FIGS. 12 and 13, and each interposer 10 can electrically connect terminals 608 on the wiring substrate 2 to terminals 508 on the probe substrate 8 as shown in FIGS. 12 and 13.

The probe substrate 8 can comprise any suitable structure for supporting probes 4 and include one or more sub-layers and/or substrates. For example, the probe substrate 8 can comprise a ceramic substrate comprising the electrical paths (not shown) mentioned above between the terminals 508 and the probes 4. In some embodiments, the probe substrate 8 can be configured as a space transformer in which the terminals 508 are disposed spaced from one another at a first pitch, and the probes 4 are spaced from one another at a second pitch, which can be smaller than the first pitch.

As generally shown in FIGS. 12 and 13, to establish and maintain electrical connections between the terminals 608 on the bottom surface 5 of the wiring substrate 2 and the terminals 508 on the probe substrate 8, the interposers 10 should be located with sufficient precision that interposer contacts 504 align with the wiring substrate terminals 608 and the interposer contacts 506 align with the probe substrate terminals 508. Moreover, the foregoing alignment of interposer contacts 504 with wiring substrate terminals 608 and interposer contacts 506 with probe substrate terminals 508 should be maintained (e.g., during transport, adjustment, and use of the probe card assembly 1) in order to maintain the electrical connections between the terminals 608 on the bottom surface 5 of the wiring substrate 2 and the terminals 508 on the probe substrate 8.

Figure 14:
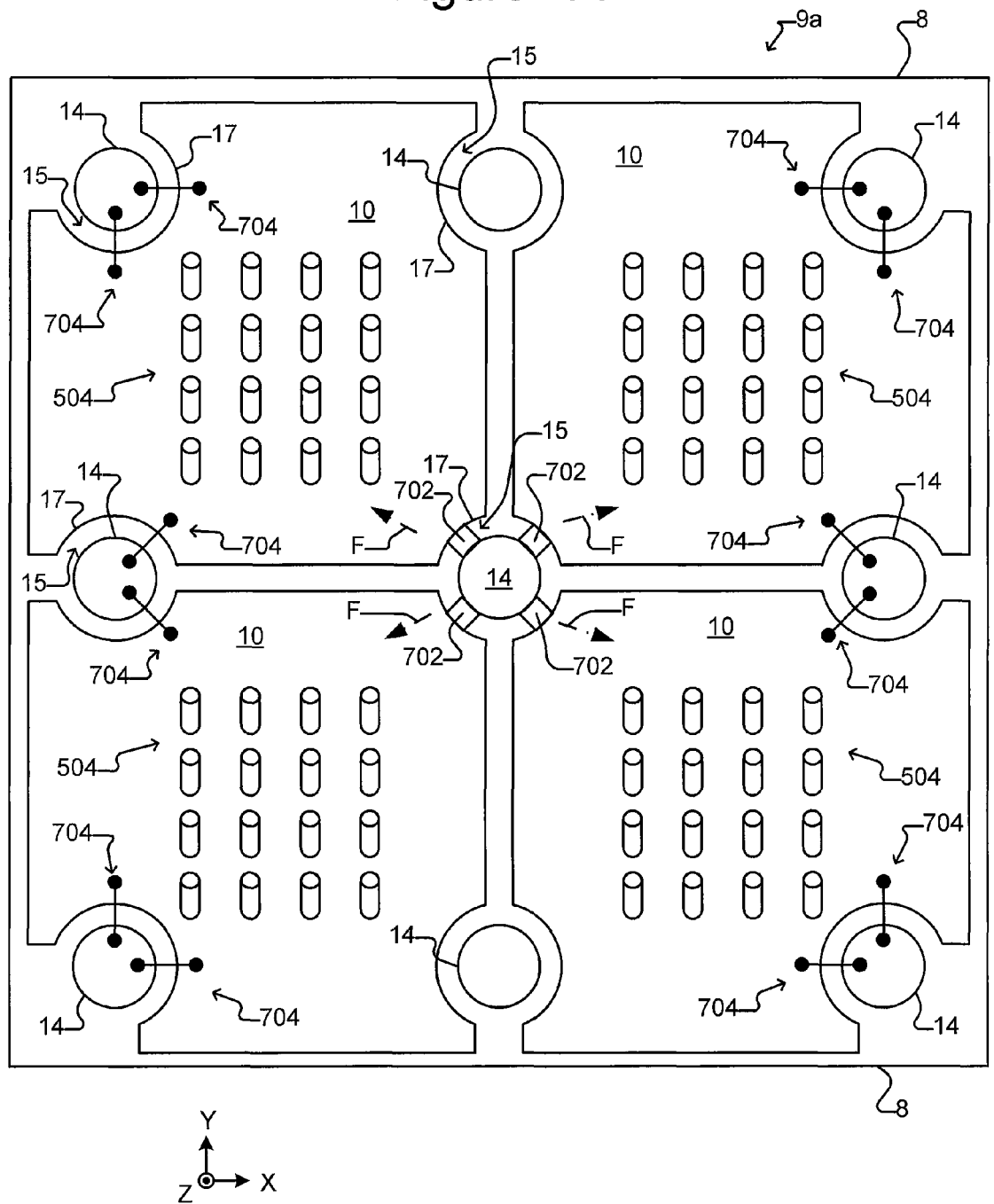
FIG. 14 is a top view of the probe head assembly of FIG. 11 with exemplary biasing mechanisms and constraints according to some embodiments of the invention.

FIG. 14 illustrates an exemplary use of techniques like those illustrated in FIGS. 1-7 to align interposers 10 of the probe head assembly 9a with the wiring substrate 2 and the probe substrate 8 of the probe head assembly 9a. The interposers 10 of the probe head assemblies 9b, 9c, 9d can be similarly aligned. As will be seen, the illustrated technique can be a self-help technique. In the following example, the interposer 10 can be a non-limiting example of the first structure 212 of FIGS. 1-7, and the studs 14 can be non-limiting examples of alignment features 204, 206, 208, 210 of FIGS. 1-7. Because studs 14 are attached to probe substrate 8 and extend through holes 204 in wiring substrate 2 (see FIGS. 8 and 10 and the accompanying discussion of those figures above) and can thus be located in positions defined by holes 204 with respect to the wiring substrate 2, the interposer 10 can be aligned to both the wiring substrate 2 and the probe substrate 8 using techniques like those illustrated in FIGS. 1-7. The wiring substrate 2 and probe substrate 8 together can thus be a non-limiting example of the second structure 202 of FIGS. 1-7.

As shown in FIG. 14, each interposer 10 can be disposed generally in an "x, y" plane. In FIG. 14, the "x, y" plane is in the plane of the page, and the "z" axis extends out of the page. Biasing mechanisms 702 can apply a biasing force F to each interposer 10. Although one biasing force F is shown applied to each interposer 10, more than one biasing force can alternatively be applied to each interposer 10. The biasing force F applied to each interposer 10 can tend to move the interposer 10 towards and then hold the interposer 10 in a position in which contacts 504 of the interposer align with terminals 608 on the bottom surface 5 of the wiring substrate and contacts 506 of the interposer 10 align with terminals 508 on the probe substrate 8. As shown in FIG. 14, a plurality of constraints 704 can be provided for each interposer 10, and the constraints 704 can be configured and positioned to stop the biasing force F induced movement of the interposer 10 in a position in which the contacts 506, 508 of the interposer 10 align with the wiring substrate terminals 608 and probe substrate terminals 508 as described above. The constraints 704 can be configured and positioned such that: (1) once the biasing force F on the interposer 10 moves the interposer 10 against the constraints 704, the constraints 704 hold the interposer 10 in place by preventing the interposer 10 from moving in the "x" or "y" directions and from rotating about the "z" axis; and (2) while the interposer 10 is in place, contacts 504 of the interposer 10 align with terminals 608 on the bottom surface 5 of the wiring substrate 2, and contacts 506 of the interposer 10 align with terminals 508 on the probe substrate 8. In some embodiments, the size of the biasing force F applied to an interposer 10 can be selected to just overcome frictional forces opposing movement of the interposer 10 with respect to probe substrate 8 and wiring substrate 2.

As mentioned, studs 14 can be non-limiting examples of the alignment features 204, 206, 208, 210 of FIGS. 1-7. As shown in FIG. 14, each interposer 10 can be a non-limiting example of the first structure 212 and can include docking/biasing features 15 that are the same as or generally similar to docking/biasing features 214, 216, 218, 220 in FIGS. 1-7. For example, docking/biasing features 15 can comprise cutouts as shown in FIG. 14 with edges 17 that can be the same as or generally similar to edges 224, 226, 228, 230 of FIGS. 1-7. Force F produced by biasing mechanism 702 in FIG. 14 can be the same as or similar to the force F in FIG. 5, and constraints 704 can be the same as or similar to constraints 320, 322, 324 in FIGS. 1-7. For example, biasing mechanism 704 can be a spring like spring 472 of FIG. 6A, and constraints 704 can comprise protrusions like one or more of protrusions 474, 476, 478 of FIG. 6A. Moreover, the point or area of application and direction of force F in FIG. 14 can be the same as or generally similar to and can be determined or selected in the same or similar manner as the force F of FIG. 5. The position and orientation of constraints 704 can also be determined or selected in the same or similar manner as the constraints 320, 322, 324 in FIG. 3.

Nevertheless, the placement, orientation, and number of biasing mechanisms 702 and constraints 704 for each interposer 10 shown in FIG. 14 is exemplary only, and other placements, orientations, and numbers of biasing mechanisms 702 and constraints 704 can be used with each interposer 10. In some embodiments, a minimum number (e.g., three) of constraints 704 can be used to impede movement of each interposer 1002 along the "x" and "y" axes and rotation about the "z" axis. Indeed, generally speaking, three constraints are typically sufficient to impede movement of a physical body (e.g., an interposer) in a plane. In some embodiments, three constraints 704 per interposer 10 are sufficient to hold the interpose 10 in a position corresponding to proper alignment with the wiring substrate 2 and a probe substrate 8 as discussed above. In other embodiments, more than three constraints 704 per interposer 10 can be used.

Many other variations are possible. For example, multiple biasing mechanisms 702 can be provided for each interposer 10. For example, multiple springs (not shown in FIG. 14) can be disposed between an interposer 10 and multiple ones of the studs 14 in FIG. 14, which can create multiple biasing forces F acting on an interposer 10. As another example, one or more constraints 704 can be clutched. For example, one or more constraints 704 can comprise a docking feature (not shown) on the interposer configured to moveably engage a constraint (not shown) on one of the studs 14 and a clutch (not shown). The clutch (not shown) can be configured selectively to allow the docking feature (not shown) and corresponding constraint (not shown) to move with respect to each other even while in contact. The clutch (not shown) can also be configured selectively to stop movement of the docking feature (not shown) and corresponding constraint (not shown).

Figure 15:
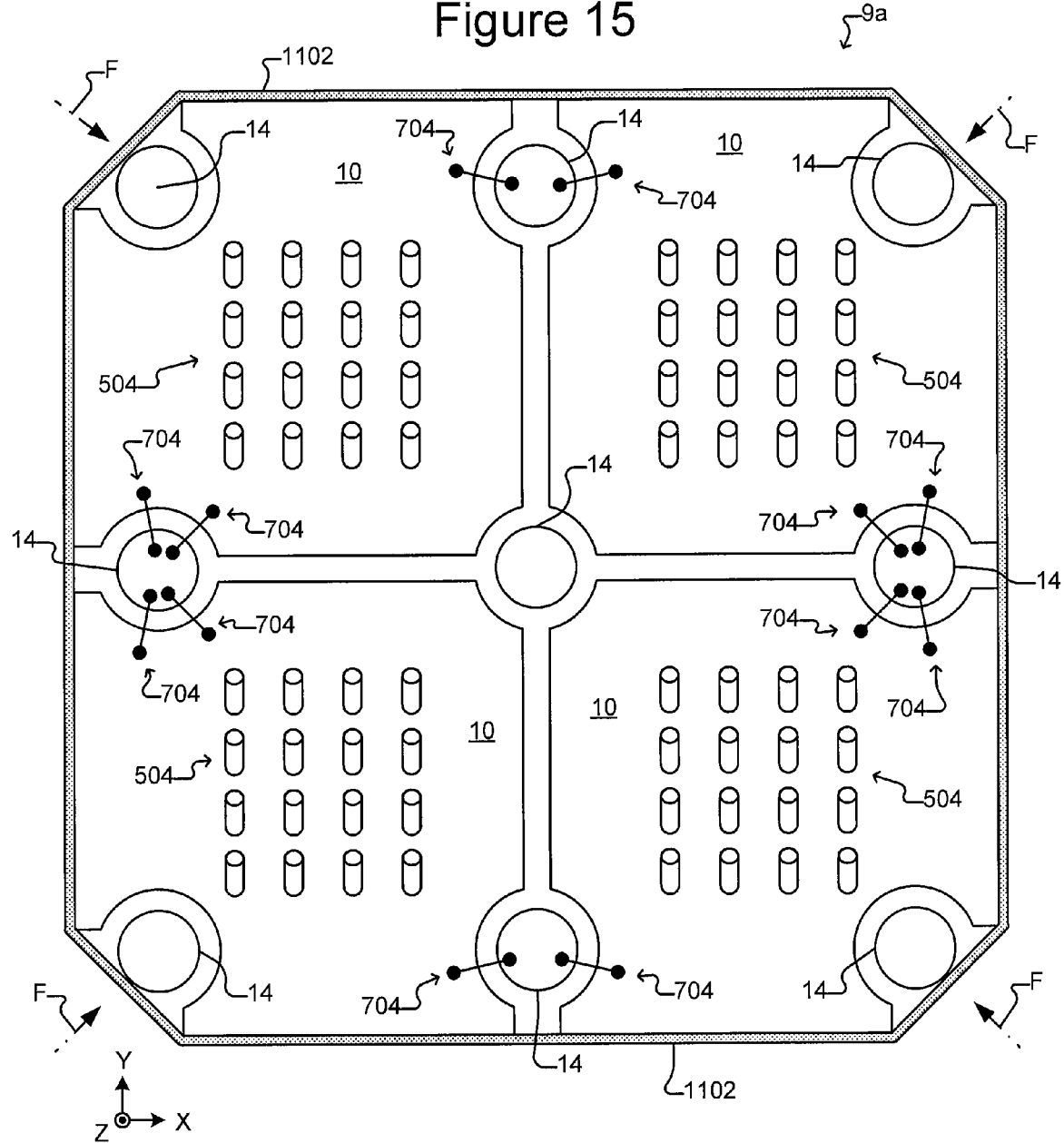
FIG. 15 is a top view of the probe head assembly of FIG. 11 with other exemplary biasing mechanisms and constraints according to some embodiments of the invention.

FIG. 15 illustrates another exemplary variation in which a band 1102 with elastic properties is disposed around the interposers 10, exerting forces F on each interposer 10 tending to push the interposer 10 towards the center stud 14. The band 1102 can thus be an exemplary implementation of the biasing mechanisms 702 of FIG. 14. Constraints 704 can be placed on each interposer 10 to restrict movement of the interposer 10. The locations and orientations of constraints 704 can be determined or selected utilizing the techniques illustrated in FIGS. 1-6, and constraints 704 can be implemented as protrusions (e.g., like one or more of protrusions 474, 476, 478 including any variations (e.g., as shown in FIG. 7) described herein).

Figure 16:
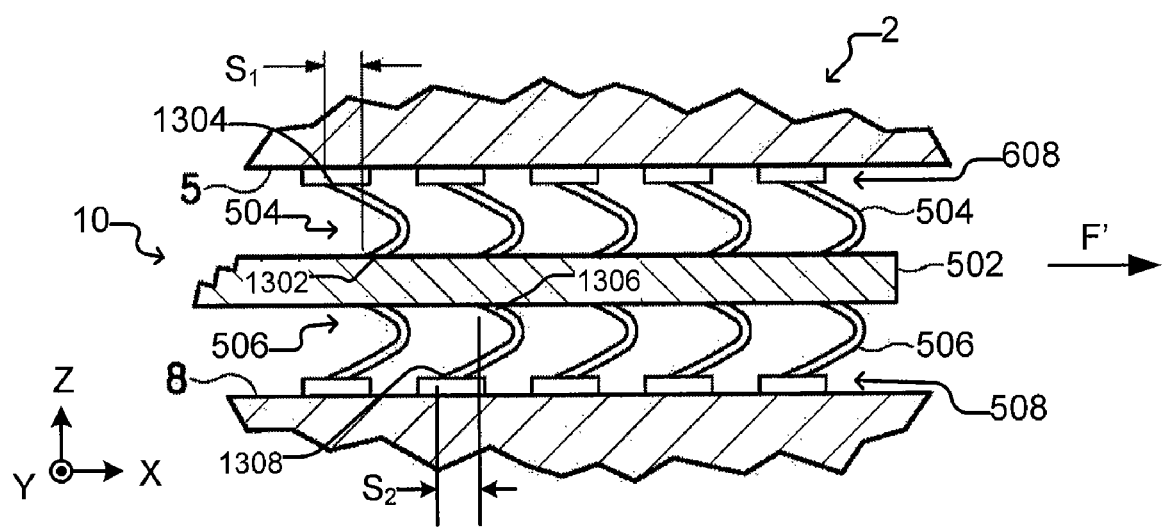
FIG. 16 is a side view of an interposer with offset contacts that are under compression and generating a lateral force F' according to some embodiments of the invention.

FIG. 16 illustrates yet another variation. In FIG. 16, which shows partial side views of the wiring substrate 2, an interposer 10, and a probe substrate 8, the contacts 504, 506 of the interposer 10 are configured to provide a biasing force F on the interposer 10. As shown, a tip end 1304 (e.g., an end that physically contacts a terminal 608 of the wiring substrate 2) of each contact 504 can be offset from an attachment end 1302 (e.g., an end that is attached to the interposer substrate 502) of the contact 504. For example, the offset can be by a distance $S_1$ as shown in FIG. 16. As also shown, a tip end 1308 (e.g., an end that physically contacts a terminal 508 of the probe substrate 8) of each contact 506 can be offset from an attachment end 1306 (e.g., an end that is attached to the interposer substrate 502) of the contact 506. For example, the offset can be by a distance $S_2$ as shown in FIG. 16, which can be the same or different than the distance $S_1$.

Because of the offset distances $S_1$ and $S_2$, the contacts 504, 506 can generate a lateral force F' when compressed between the wiring substrate 2 and the probe substrate 8. The contacts 504, 506 can be compressed between the wiring substrate 2 and the probe substrate 8, for example, by fastening mechanisms 106 (see FIG. 8). For example, as discussed above, the fastening mechanisms 106 can be configured to attach probe substrates 8 to the stiffener plate 7, and as such, the fastening mechanisms 106 can pull the probe substrates 8 towards the stiffener plate 7 and thus compress the interposers 10 between the probe substrates 8 and the wiring substrate 2. The lateral force F' can be in addition to vertical forces (not shown) against the wiring substrate 2 and the probe substrate 8. In some embodiments, the lateral force F' can be oriented in the same or generally the same direction as the biasing force F applied to the interposer 10.

As mentioned, the lateral force F' can be in place of any of the forces F shown in the Figures. For example, the contacts 504, 506 with offset distances $S_1$ and/or $S_2$ can take the place of the biasing mechanism 702 in FIG. 14 or spring 472 in FIG. 6A. Alternatively, the lateral force F' on an interposer 10 shown in FIG. 16 can be in addition to any of the forces F shown in the Figures. In such a case, for example, the total force on each interposer 10 in FIG. 14 or FIG. 15 would be the vector sum of the force F generated by a biasing mechanism 702 acting on the interposer 10 and the lateral force F' generated by the interposer 10 itself due to offset distances $S_1$ and/or $S_2$ of its contacts 504, 506. As mentioned, in some embodiments, the size of the biasing force F' can be selected to just overcome frictional forces opposing movement of the interposer 10 with respect to probe substrate 8 and wiring substrate 2.

Figure 17A:
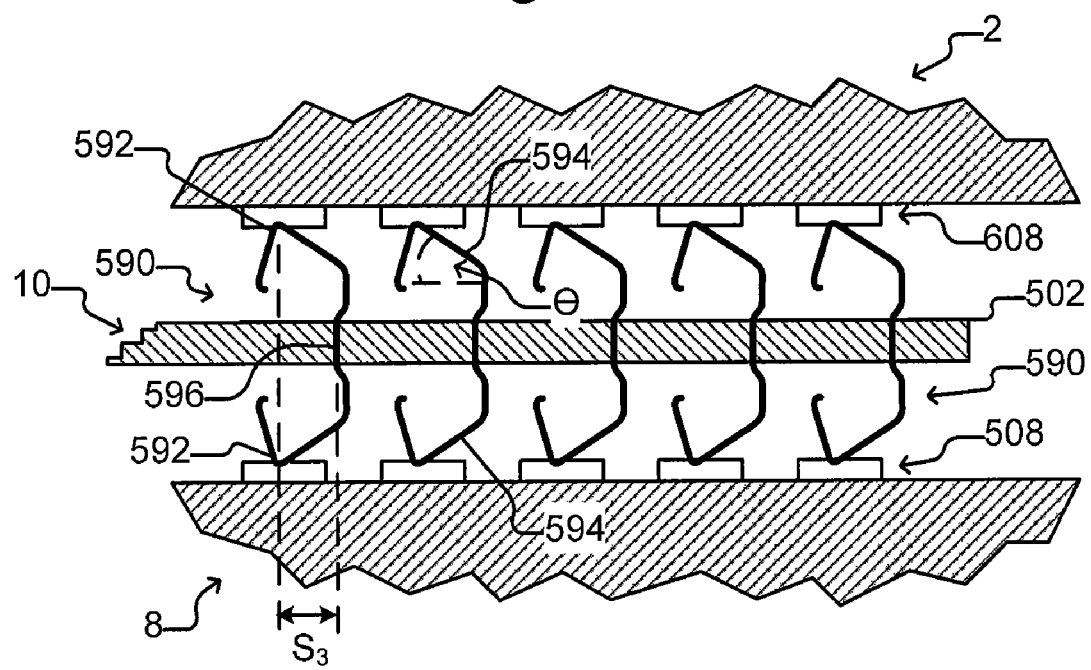
FIG. 17A is a side view of an interposer with contacts that under compression generate a lateral force F" according to some embodiments of the invention.
Figure 17B:
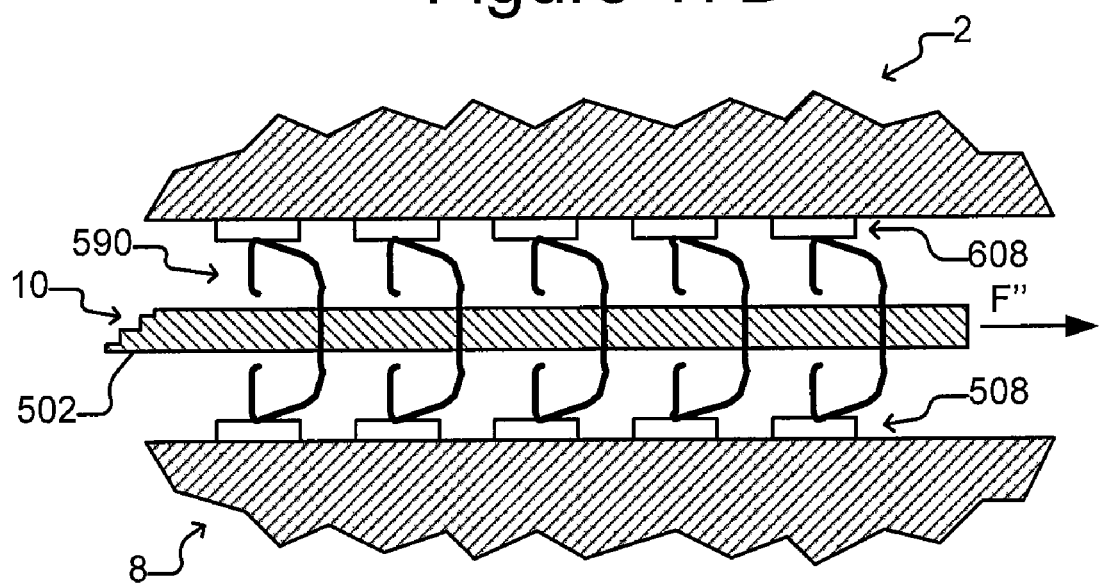
FIG. 17B shows the interposer of FIG. 17A under compression.

FIGS. 17A and 17B (which show partial side views of the wiring substrate 2, an interposer 10, and a probe substrate 8) illustrate another exemplary configuration in which contacts 590 of the interposer 10 can be configured to provide a biasing force F'' on the interposer. Contacts 590, which can replace contacts 504, 506, can include a body portion 596 that is embedded or otherwise secured in the interposer substrate 502, and contacts 590 can also include contact portions 592 that engage and are compressed between terminals 608 of the wiring substrate 2 and terminals 508 of the probe substrate 8. FIG. 17A shows contacts 590 in an uncompressed state, and FIG. 17B shows contacts 592 in a compressed state. As shown, the contact portions 592 of each contact 590 can be offset $S_3$ from the body portion 596, and the arms 594 of each contact 590 can be angled θ. The offset $S_3$ of the contact portions 592 and/or the angled θ arms can cause each contact 590 to exert lateral forces on the interpose substrate 502 as the contacts 590 are compressed. The sum of such lateral forces can be lateral force F'' on the interposer substrate 502 as shown in FIG. 17B.

A generally discussed above with respect to FIG. 16, the contacts 590 can be compressed between the wiring substrate 2 and the probe substrate 8, for example, by fastening mechanisms 106 (see FIG. 8). For example, as discussed above, the fastening mechanisms 106 can be configured to attach probe substrates 8 to the stiffener plate 7, and as such, the fastening mechanisms 106 can pull the probe substrates 8 towards the stiffener plate 7 and thus compress the interposers 10 between the probe substrates 8 and the wiring substrate 2. The lateral force F'' can be in addition to vertical forces (not shown) against the wiring substrate 2 and the probe substrate 8. In some embodiments, the lateral force F'' can be oriented in the same or generally the same direction as the biasing force F applied to the interposer 10.

Like force F' discussed above, lateral force F'' can take the place of any of the forces F shown in the Figures. For example, the contacts 590 can take the place of biasing mechanisms 702 in FIG. 14 or spring 472 in FIG. 5. Alternatively, the lateral force F'' can be in addition to any of the forces F shown in the Figures. In such a case, for example, the total force on each interposer 10 would be the vector sum of the force F generated by a biasing mechanism 702 acting on the interposer 10 and the lateral force F'' generated by the interposer 10 itself upon compression of contacts 590. Again, in some embodiments, the size of the biasing force F'' can be selected to just overcome frictional forces opposing movement of the interposer 10 with respect to probe substrate 8 and wiring substrate 2.

Figure 18:
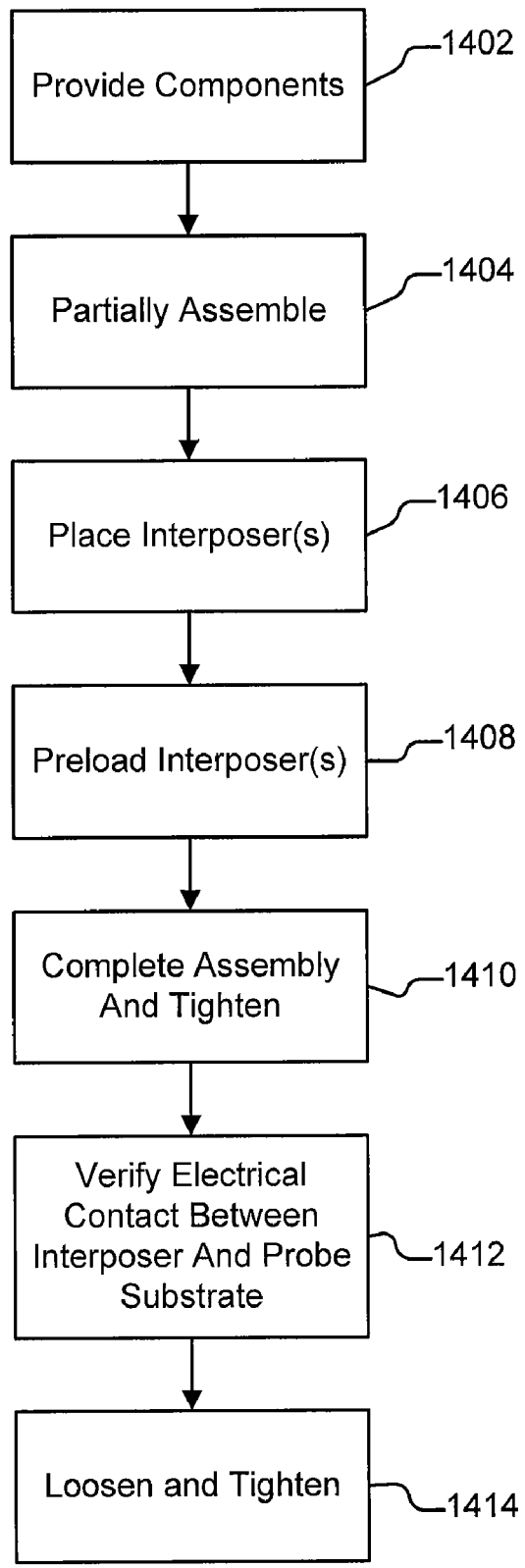
FIG. 18 illustrates an exemplary process for making a probe card assembly according to some embodiments of the invention.

FIG. 18 illustrates an exemplary process for making a probe card assembly according to some embodiments of the invention. Although the process of FIG. 18 is not limited to making a probe card assembly like the probe card assemblies illustrated in FIGS. 8-17B, the process of FIG. 18 will be described herein with regard to making the probe card assembly 1 illustrated in FIGS. 8-14, including variations shown in FIGS. 15-17B. As shown in FIG. 18, components of the probe card assembly 1 can be provided at 1402. For example, the wiring substrate 2, the stiffener plate 7, the probe substrates 8, the interposers 10, and the studs 14 can be provided at 1402. At 1404, the components provided at 1402 can be partially assembled. At 1406, the interposers 10 can be placed on the probe substrates 8, and preloaded with a biasing force at 1408. For example, interposers 10 can be placed on probe substrates 8 as generally shown in FIG. 10. (See also FIG. 11.) The interposers 10 can be preloaded with biasing forces like biasing forces F shown in FIG. 14. As discussed above, the biasing forces F can press the interposers 10 against constraints 704, positioning each of the interposers 10 such that contacts 504, 506 align, respectively, with terminals 608 on the wiring substrate 2 and terminals 508 on a probe substrate 8 as generally discussed above. Any of the techniques discussed herein for providing biasing forces F can be used. At 1410, the probe card assembly can be fully assembled as, for example, generally shown in FIGS. 8 and 9, and the attachment mechanisms 106 can be tightened, which can tighten the probe substrate 8 against the wiring substrate 2, compressing each of the interposers 10 between probe substrate 8 and wiring substrate 2 as generally shown in FIGS. 8 and 13. As discussed above, the biasing forces F should continue to press the interposers 10 against constraints 704, which should maintain the interposers 10 in proper alignment with the wiring substrate 2 and a probe substrate 8 as discussed above. The interposers 10 can be configured as shown in FIG. 16 or FIGS. 17A and 17B, and if so, the additional lateral force F' or F" can further press the interposers 10 against constraints 704. Interposers 10, however, need not be configured as shown in FIGS. 16, 17A, and 17B. Optionally, in some embodiments, all or part of the biasing force (e.g., force F, force F', and/or force F") can be removed once the attachment mechanisms 106 are tightened. Once tightened, the attachment mechanisms 106 can hold the interposers 10 in the proper position with respect to the probe substrate 8 and the wiring substrate 2 without the biasing force or with less than the full biasing force.

At 1412, electrical connectivity between the wiring substrate 2 and the probe substrates 8 through the interposers 10 can be tested. If no or poor (e.g., excessively low) electrical conductivity is detected at 1412 between one or more of the interposers 10 and either the wiring substrate 2 or a probe substrate 8, selected ones of the attachment mechanisms 106 associated with affected one or more of the probe head assemblies 9a, 9b, 9c, 9d can be loosened sufficiently to allow the low conductive interposers 10 to return to their natural position due to one or more biasing forces F. As discussed above, the natural position of an interposer 10 due to one or more biasing forces F can align contacts 504, 506, respectively, with terminals 608 on the wiring substrate 2 and terminals 508 on a probe substrate 8. Those attachment mechanisms 106 can then be retightened, and as discussed above, the biasing forces F can maintain the interposers 10 in proper alignment with the wiring substrate 2 and probe substrate 8 as and after the attachment mechanisms 106 are tightened.

As discussed above, the contacts 504, 506 can be configured with offsets $S_1$ and $S_2$ shown in FIG. 16 or contacts 590 as shown in FIGS. 17A and 17B, which can cause the contacts 504, 506 to exert a lateral force F' as also shown in FIG. 16 or the contacts 590 to exert a lateral force F" as shown in FIGS. 17A and 17B. As discussed above, such lateral force F' or F" can be configured to add to and thus augment the biasing forces F applied to the interposers 10 (e.g., see FIGS. 14 and 15). Alternatively, as also discussed above, no biasing forces F need be applied to the interposers 10 (in which case 1408 of FIG. 18 can be skipped or not included in the process of FIG. 18), and lateral forces F' or F" can bias each interposer 10 into corresponding constraints 704.

Figure 19:
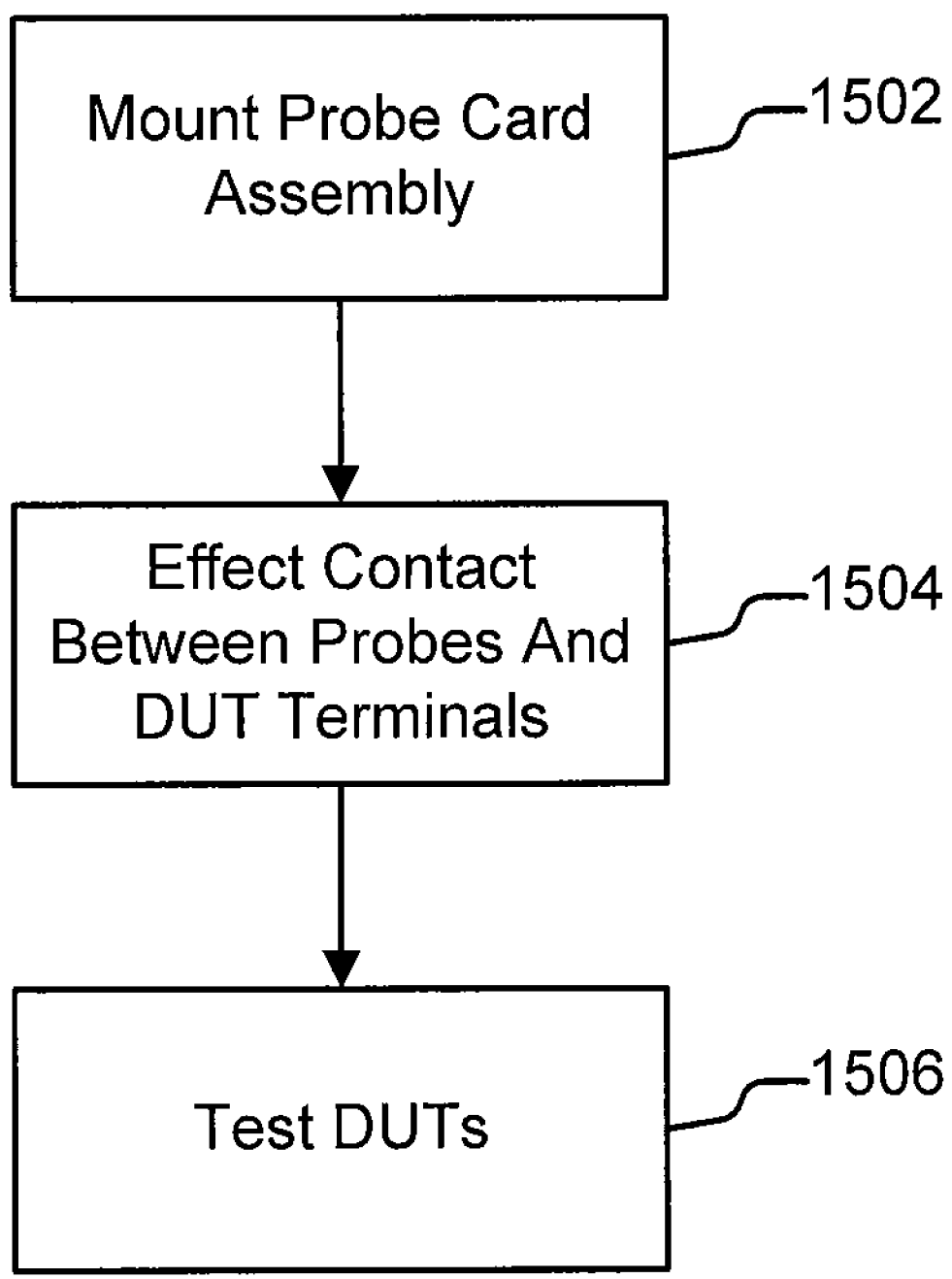
FIG. 19 illustrates an exemplary process for using a probe card assembly to test electronic devices.

FIG. 19 illustrates an exemplary process for using a probe card assembly, like probe card assembly 1, to test DUTs according to some embodiments of the invention. Although the process of FIG. 19 is not so limited, the process of FIG. 19 will be described herein in terms of utilizing the probe card assembly 1 in the test system 100 of FIG. 8.

At 1502, the probe card assembly 1 can be mounted onto a mounting structure 114 as shown in FIG. 8. As discussed above, the mounting structure 114 can be part of a housing in which the chuck 112 is located. At 1504, the chuck 112 can move the DUTs 110 to align terminals of ones of the DUTs 110 with probes 4 of the probe card assembly 1, and the chuck 112 can then move the DUTs 110 such that the terminals of ones of the DUTs 110 are pressed against and thus make electrical contact with the probes 4. At 1506, the tester 102 can test the DUTs 110 by outputting test signals through the channels 104 and probe card assembly 1 to terminals of the DUTs 110 as discussed above. The tester 102 can also receive through the probe card assembly 1 and channels 104 response signals generated by the DUTs 110 in response to the test signals. The tester 102 can evaluate the response signals as also discussed above.

During testing at 1506, the relative positions of the interposers 10 with respect to the wiring substrate 2 and the probe substrates 8 can change. For example, changes in ambient temperature around the probe card assembly 1 during testing can cause some components of the probe card assembly 1 to expand or contract more than other components of the probe card assembly 1. This can arise because some components of the probe card assembly 1 have different coefficients of thermal expansion. This can also arise because of temperature gradients around the probe card assembly 1. For example, the wiring substrate 2 might, under some circumstances expand more rapidly than the interposers 10 and/or the probe substrates 8. As another example of changes in positions of the interposers 10 with respect to the wiring substrate 2 and the probe substrates 8, such changes can occur due to mechanical loading applied to the probe card assembly 1 during testing at 1506. The biasing forces F and/or the lateral forces F' or F" can keep the interposer contacts 504, 506 properly aligned with terminals 608 on the wiring substrate 2 and terminals 508 on the probe substrate 8 during testing at 1506, even as components of the probe card assembly 1 expand at different rates during the testing at 1506 or otherwise move during testing at 1506. Moreover, if needed (e.g., electrical conductivity between one or more of the interposers 10 and either the wiring substrate 2 or a probe substrate 8 is lost or becomes too low during test testing at 1506), 1414 of FIG. 18 can be performed on the probe card assembly 1 while the probe card assembly 1 remains attached to the mounting structure 114.

As should be apparent, the biasing forces F applied to interposers 10 by biasing mechanisms 702 (see FIGS. 14-19) and/or the lateral force F' or F" generated by an interposer 10 with offset contacts 504, 506 or contacts 590 (see FIGS. 16, 17A, and 17B) and the constraints 702 can be designed to move the interposers 10 automatically into proper alignment with the wiring substrate 2 and a probe substrate 8 and then hold the interposers 10 in such alignment. The biasing mechanisms 702 and constraints 704 can thus form a self-help system.

The foregoing self-help system, including the techniques illustrated in FIGS. 1-7, is not limited to aligning an interposer 10 to a wiring substrate 2 and a probe substrate 8. For example, the techniques illustrated in FIGS. 1-7 and exemplified in FIGS. 8-17B can alternatively or additionally be used to automatically align the probe substrates 8 to the wiring substrate 2 and/or the stiffener plate 7. Likewise, the techniques illustrated in FIGS. 1-7 and exemplified in FIGS. 8-17B can alternatively or additionally be used to automatically align the wiring substrate 2 to the stiffener plate 7.

Indeed, the techniques illustrated in FIGS. 1-7 and exemplified in FIGS. 8-17B can be used in devices and apparatuses other than a probe card assembly like probe card assembly 1. For example, such techniques can be used to automatically align interposers and/or probe substrates in other types of contactor devices used in testing DUTs. As another example, such techniques can be used in other types of electronic devices or non-electronic devices to align a substrate or structure with another substrate or structure. Thus, the interposers 10, probe substrates 8, and wiring substrate 2 are merely examples of structures or components that can be aligned one with another using the techniques illustrated in FIGS. 1-7 and exemplified in FIGS. 8-17B. The interposers 10, probe substrates 8, and wiring substrate 2 can thus be examples of first, second, and third electronic components aligned using the self help techniques disclosed herein.

Figure 20:
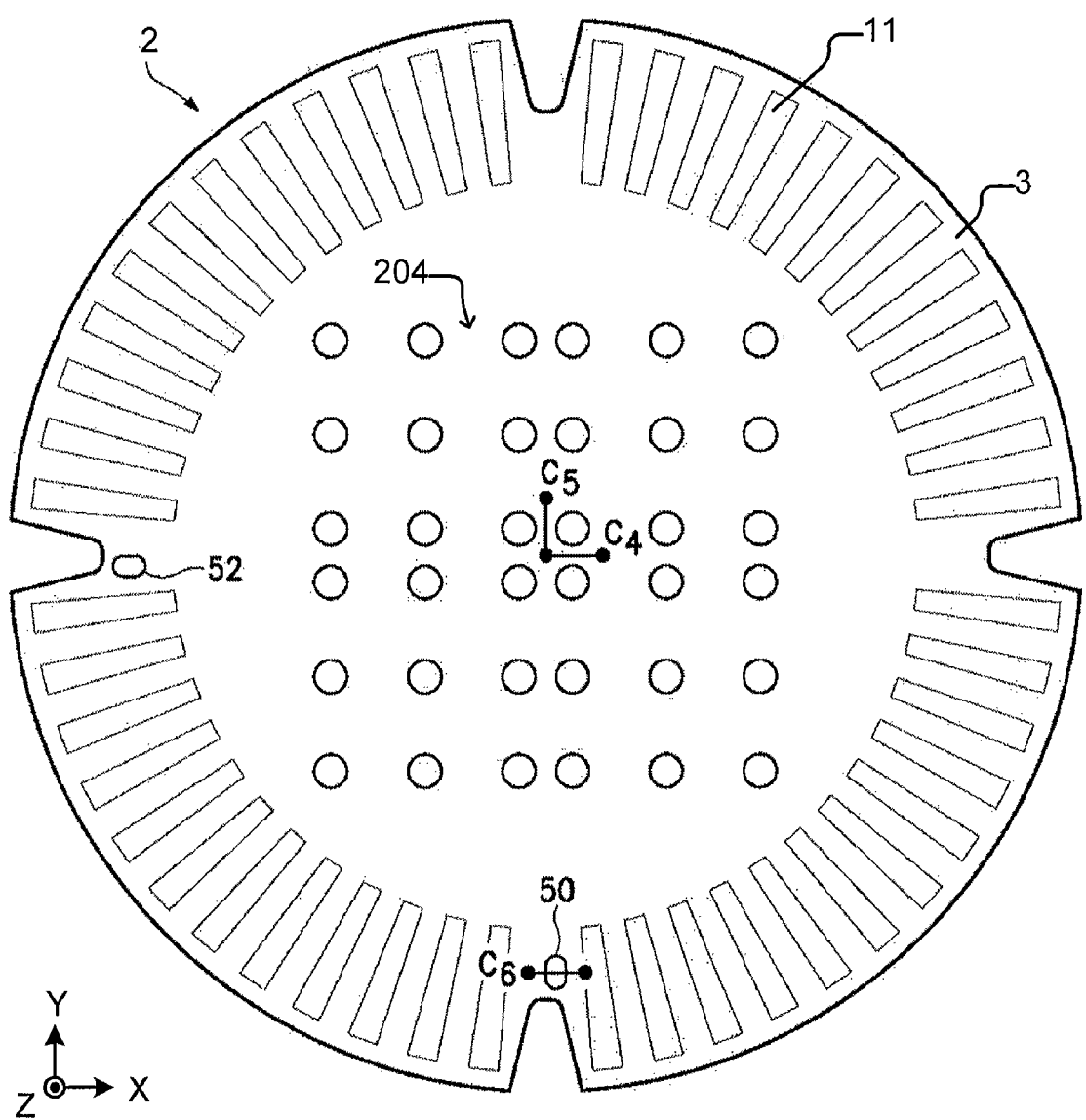
FIG. 20 is a top view of the wiring substrate of the probe card assembly of FIG. 9.
Figure 21:
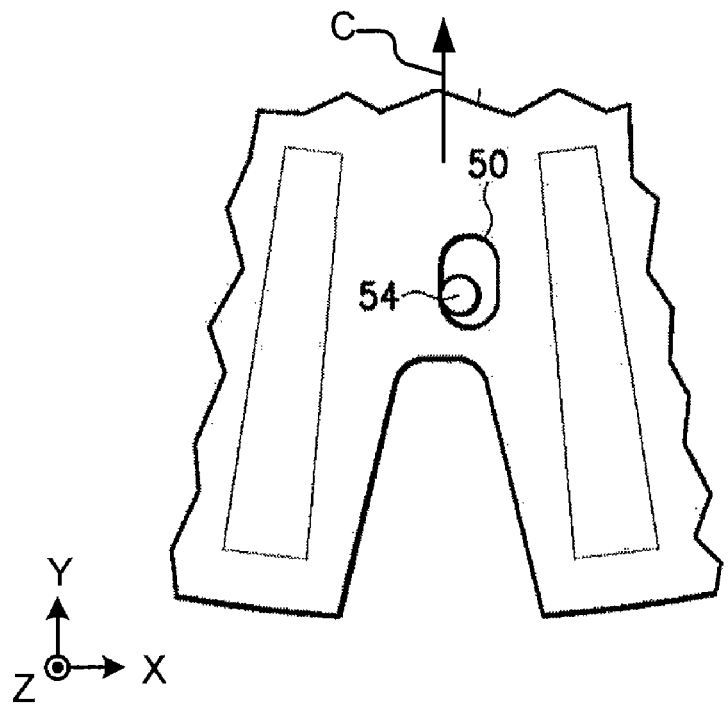
FIG. 21 is an enlarged view of a portion of the wiring substrate of FIG. 20.
Figure 22:
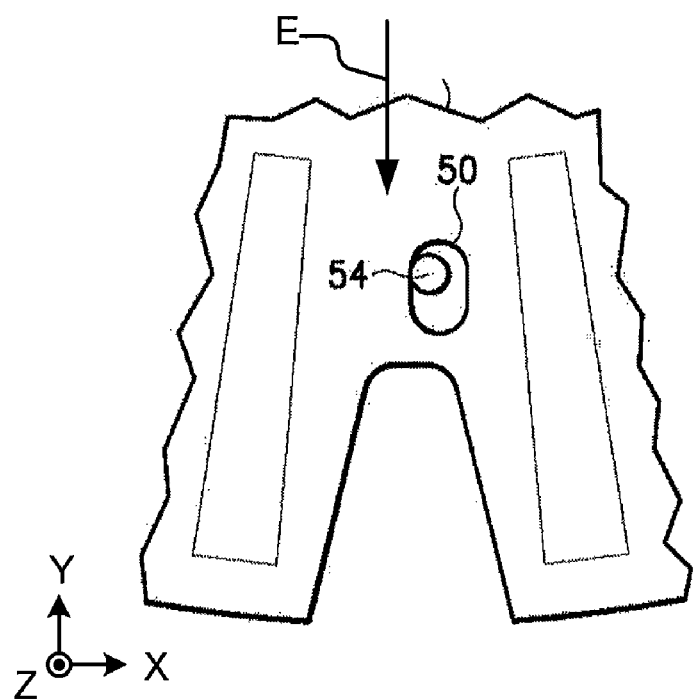
FIG. 22 is a view similar to FIG. 20 but with the wiring substrate shown in a state of radial expansion.

FIGS. 20-22 illustrate additional features of the probe card assembly 1 that can be utilized during testing of the DUTs 110 at 1506 of FIG. 20 according to some embodiments of the invention. FIG. 20 shows a top view of the wiring substrate 2. As shown, the wiring substrate 2 can have a plurality of kinematic constraints C4, C5 and C6. Three constraints C4, C5, C6 are shown but more or fewer can be used. Constraints C4 and C5, for example, may constrain the wiring substrate 2 in two directions of travel in a two dimensional plane determined by the surface of the wiring substrate 2 shown in FIG. 20. For example, constraints C4, C5 can constrain movement of the wiring substrate 2 in the "x" and "y" directions. A single screw or bolt, for example, attached at or near a center point of the wiring substrate 2 can provide the constraints C4 and C5. A third constraint C6 may also be configured to constrain the wiring substrate 2 from rotating about the "z" axis.

As discussed above, the probe card assembly 1 may include a stiffening plate, such as stiffening plate 7 (not shown in FIG. 20), mounted on the wiring substrate 2. The stiffening plate 7 may provide the wiring substrate 2 with additional rigidity. This additional rigidity can reduce the amount of flexing that may otherwise occur in the wiring substrate 2 as a result of physical forces or temperature changes. Extraneous amounts of flexing in the wiring substrate 2 could result in damage or loss of electrical connectivity of some of the components, for example.

The wiring substrate 2 may be retained in part by a retention pin, for example a pin 54 shown in FIGS. 21 and 22, that allows for radial expansion or contraction of the wiring substrate 2 with respect to the stiffening plate 7. The pin 54 may also provide the rotational constraint C6, for example. The stiffening plate 7 and the wiring substrate 2 may be composed of different materials that have dissimilar coefficients of thermal expansion that may result in a bimetallic response. These thermal properties may result in one of the components being more prone to expansion and contraction than the other during changes in thermal conditions.

Pin 54 included in slot 50 of FIG. 20, as can best be viewed in FIGS. 21 and 22, as well as the constraints C4, C5 and C6 may be configured such that the radial expansion or contraction of the wiring substrate 2 may be accommodated while retaining a fixed relative position of the wiring substrate 2 in the two dimensional plane "x, y." Alternative or additional slots such as slot 52 may similarly by included in the wiring substrate 2 in which to provide a means for constraint and radial expansion.

FIG. 21 shows the relationship of the slot 50 and the pin 54 while the wiring substrate 2 is in a state of radial contraction C. The shape of the slot 50 allows for movement of the wiring substrate 2 with respect to the pin 54 while still maintaining a rotational constraint C6 (e.g., preventing rotation about the "z" axis). Radial contraction C may occur when the wiring substrate 2 is being stored or operated at or below room temperature, for example. FIG. 22 is a view similar to that shown in FIG. 21, except that the wiring substrate 2 is in a state of radial expansion E. The radial expansion E may occur when the wiring substrate 2 is being stored or operated at a temperature greater than the temperature that resulted in the wiring substrate 2 being in a state of radial contraction C, as shown in FIG. 21.

Although specific embodiments and applications of the invention have been described in this specification, there is no intention that the invention be limited these exemplary embodiments and applications or to the manner in which the exemplary embodiments and applications operate or are described herein.

We claim:

1. An assembly for testing electronic devices comprising:
 a probe substrate having test probes;
 a wiring substrate secured to the probe substrate;
 an interposer disposed between the probe substrate and the wiring substrate and comprising resilient springs extending from opposing sides and configured to electrically connect first terminals on the wiring substrate and second terminals on the probe substrate; and
 biasing means for biasing in a direction that is generally parallel with planes in which the first terminals and the second terminals are disposed the interposer against a plurality of constraints, wherein while the interposer is biased against the constraints by the biasing means, the resilient springs of the interposer align with the first terminals on the wiring substrate and the second terminals on the probe substrate.

2. The assembly of claim 1, wherein:
 the interposer comprises docking features; and
 the biasing means biases the docking features of the interposer against the constraints.

3. The assembly of claim 1, wherein the biasing means comprises a spring.

4. The assembly of claim 1, wherein the biasing means comprises the resilient springs, the resilient springs being configured to apply a lateral force to the interposer upon application of a second force approximately perpendicular to the lateral force compressing the resilient springs.

5. The assembly of claim 1, wherein the probes are configured to contact electronic devices to be tested, and the wiring substrate comprises an electrical interface to a plurality of channels to a tester configured to control testing of the electronic devices.

6. A self-aligning removable probe head assembly for testing electronic devices comprising:
 a probe substrate having test probes and terminals disposed generally in a first plane and electrically connected to the test probes;
 an interposer substantially constrained in a second plane that is generally parallel to the first plane by at least three constraints; and
 a biasing mechanism configured to apply a force to the interposer in the second plane that urges the interposer toward at least one of the constraints thereby moving the interposer from an unaligned position in which contact structures extending from the interposer are out of alignment with the terminals of the probe substrate to an aligned position in which the contact structures extending from the interposer are in alignment with the terminals of the probe substrate.

7. The probe head assembly of claim 6, wherein the interposer comprises docking features configured to contact the at least three constraints.

8. The probe head assembly of claim 6, wherein the probe substrate and the interposer are electrically connected by the contact structures extending from the interposer, the contact structures comprising resilient contact springs.

9. The probe head assembly of claim 8, wherein the biasing mechanism comprises ones of the contact springs, which are configured to impart the force upon compression of the contact springs.

10. The probe head assembly of claim 9, wherein attachment mechanisms by which the probe head assembly is attached to a wiring substrate comprise the constraints.

11. The assembly of claim 1, wherein the constraints are stationary with respect to the interposer in response to the biasing by the biasing means.

12. The assembly of claim 1, wherein the biasing by the biasing means does not move the constraints.

13. The assembly of claim 1, wherein the biasing means passively biases the interposer against a plurality of constraints.

14. The assembly of claim 1, wherein the constraints constrain the interposer at three and only three constraint locations.

15. The assembly of claim 1, wherein:
there are three and only three constraints,
a first of the three constraints constrains the interposer along a first degree of translation in an interposer plane that is generally parallel with the planes in which the first terminals and the second terminals are disposed,
a second of the three constraints constrains the interposer along a second degree of translation in the interposer plane, the second degree of translation being different than the first degree of translation, and
a third of the three constraints constrains the interposer in a degree of rotation in the interposer plane.

16. The probe head assembly of claim 6, wherein the constraints are stationary with respect to the interposer in response to the biasing by the biasing mechanism.

17. The probe head assembly of claim 6, wherein the force applied by the biasing mechanism does not move the constraints.

18. The probe head assembly of claim 6, wherein the biasing mechanism is configured to passively apply the force to the interposer.

19. The probe head assembly of claim 6, wherein the constraints constrain the interposer at three and only three constraint locations.

20. The probe head assembly of claim 6, wherein:
there are three and only three constraints,
a first of the three constraints constrains the interposer along a first degree of translation in the second plane,
a second of the three constraints constrains the interposer along a second degree of translation in the second plane, the second degree of translation being different than the first degree of translation, and
a third of the three constraints constrains the interposer in a degree of rotation in the second plane.

* * * * *